(12) United States Patent
Daghighian

(10) Patent No.: US 11,688,821 B2
(45) Date of Patent: Jun. 27, 2023

(54) WIRELESS GAMMA AND/OR HARD X-RAY RADIATION DETECTOR

(71) Applicant: Henry Meyer Daghighian, Redwood City, CA (US)

(72) Inventor: Henry Meyer Daghighian, Redwood City, CA (US)

(*) Notice: Subject to any disclaimer, the term of this patent is extended or adjusted under 35 U.S.C. 154(b) by 142 days.

(21) Appl. No.: 17/489,435

(22) Filed: Sep. 29, 2021

(65) Prior Publication Data

US 2023/0041758 A1 Feb. 9, 2023

Related U.S. Application Data

(60) Provisional application No. 63/225,875, filed on Jul. 26, 2021.

(51) Int. Cl.
| | | |
|---|---|---|
| *H01L 31/117* | (2006.01) | |
| *H01L 31/0203* | (2014.01) | |
| *G01T 1/24* | (2006.01) | |
| *H01L 31/0304* | (2006.01) | |
| *H01L 31/0296* | (2006.01) | |
| *H01L 31/024* | (2014.01) | |

(52) U.S. Cl.
CPC ............ *H01L 31/117* (2013.01); *G01T 1/244* (2013.01); *H01L 31/0203* (2013.01); *H01L 31/024* (2013.01); *H01L 31/02966* (2013.01); *H01L 31/0304* (2013.01)

(58) Field of Classification Search
CPC .... H01L 31/117; H01L 31/0203; G01T 1/244
See application file for complete search history.

(56) References Cited

U.S. PATENT DOCUMENTS

| | | | | | |
|---|---|---|---|---|---|
| 5,812,191 | A | * | 9/1998 | Orava | H04N 25/74 |
| | | | | | 348/E3.018 |
| 7,223,982 | B1 | * | 5/2007 | Chen | G01T 1/2928 |
| | | | | | 250/370.01 |
| 2009/0294680 | A1 | * | 12/2009 | Nikolic | G01T 1/24 |
| | | | | | 438/57 |
| 2010/0102844 | A1 | * | 4/2010 | Luke | H01L 31/112 |
| | | | | | 324/754.21 |
| 2014/0209805 | A1 | * | 7/2014 | Stowe | G01T 3/08 |
| | | | | | 250/361 R |
| 2014/0225063 | A1 | * | 8/2014 | Klem | H10K 30/10 |
| | | | | | 257/14 |
| 2016/0284811 | A1 | * | 9/2016 | Yu | H01L 21/28506 |
| 2018/0069047 | A1 | * | 3/2018 | Labayen De Inza | |
| | | | | | H01L 27/14696 |
| 2019/0383667 | A1 | * | 12/2019 | Assadi | G01T 1/00 |
| 2021/0285900 | A1 | * | 9/2021 | Farrar | H02J 50/20 |

* cited by examiner

*Primary Examiner* — Hugh Maupin
(74) *Attorney, Agent, or Firm* — Maschoff Brennan; Paul G. Johnson

(57) ABSTRACT

In an example, a wireless gamma and or hard X-ray radiation detector includes a bulk semiconductor crystal, electrical contacts, a bias circuit, and a terahertz (THz) electromagnetic (EM) wave receiver. The bulk semiconductor crystal and includes indium antimonide (InSb), cadmium telluride (CdTe), or cadmium zinc telluride (CdZnTe). The electrical contacts are coupled to two facets of the bulk semiconductor crystal. The bias circuit is electrically coupled to the bulk semiconductor crystal through the electrical contacts. The THz EM wave receiver is positioned to detect THz radiation emitted by the bulk semiconductor crystal.

21 Claims, 15 Drawing Sheets

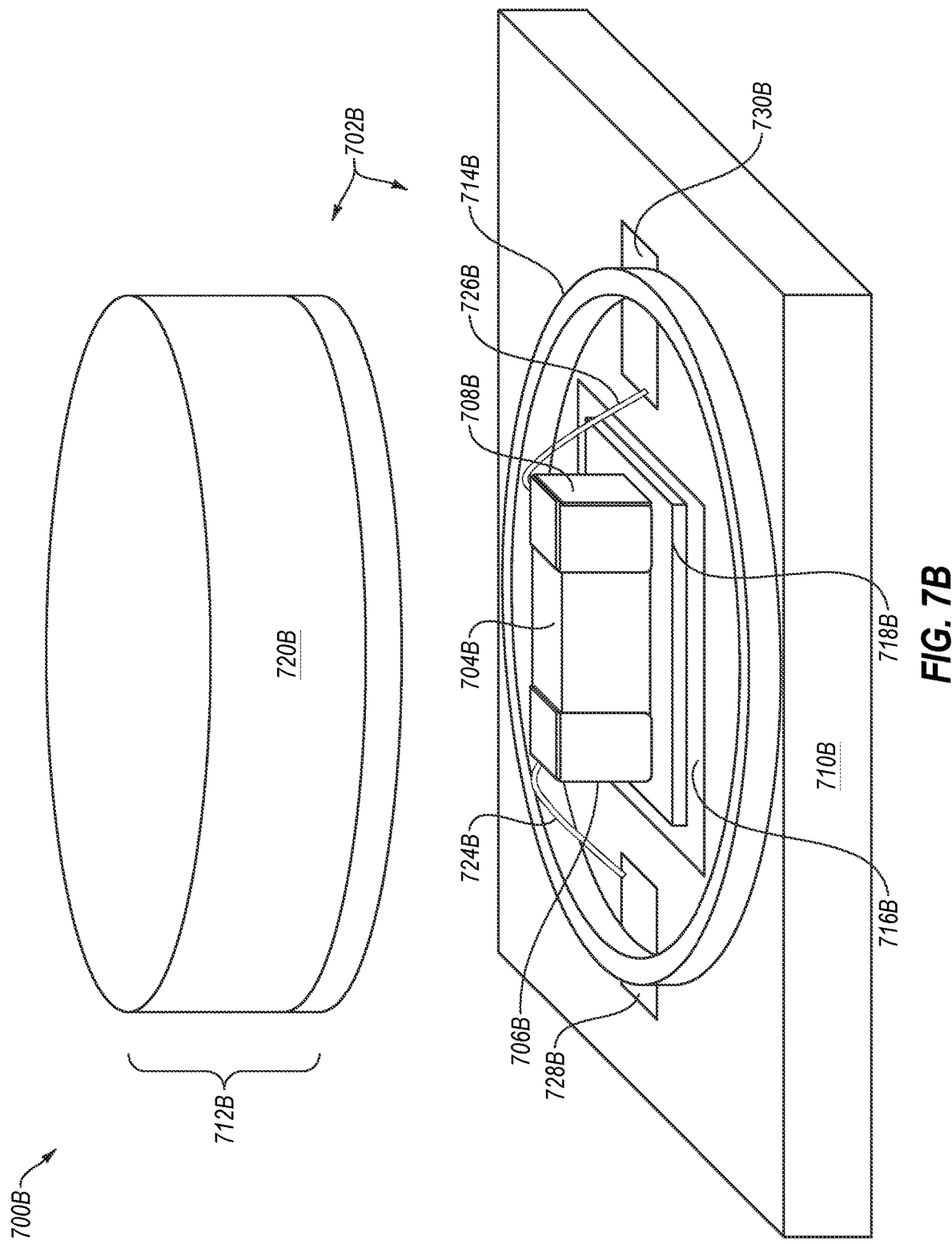

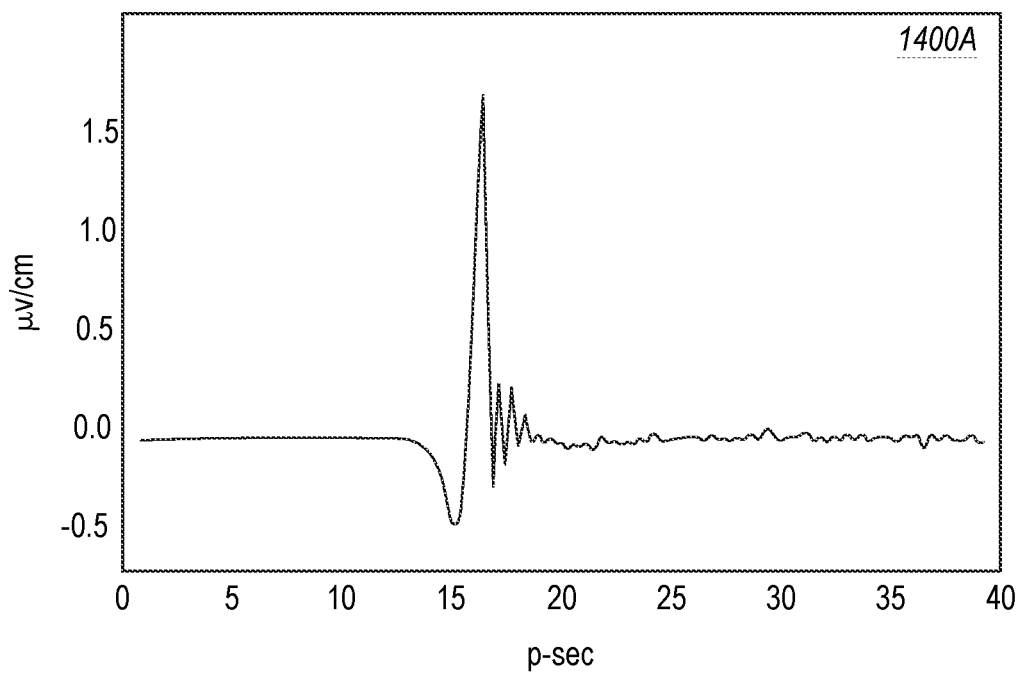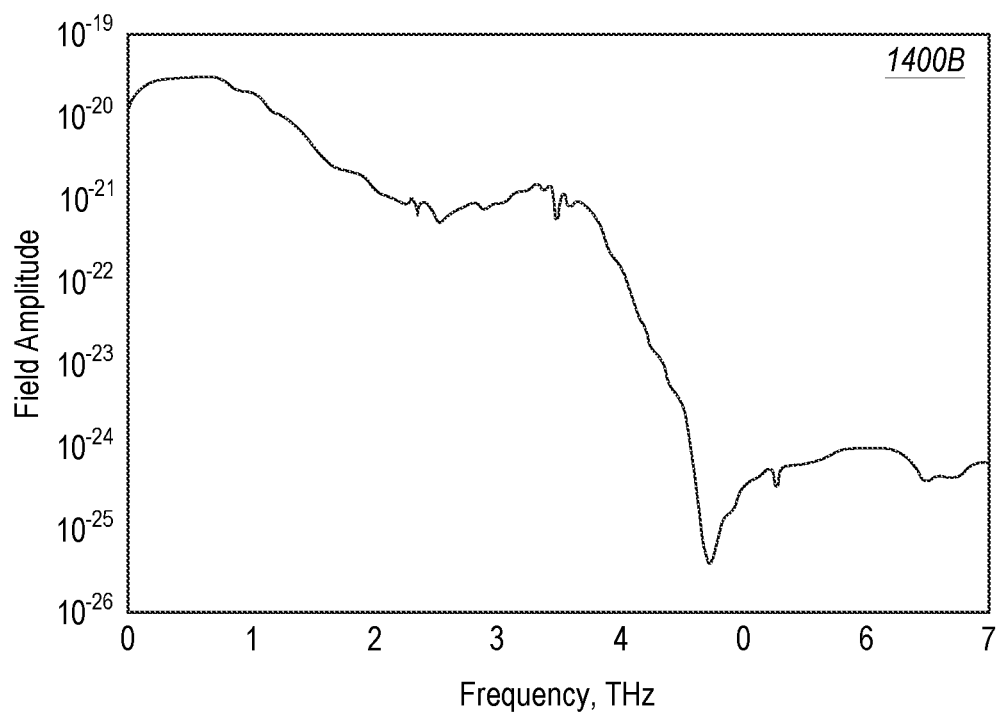
*FIG. 14*

WIRELESS GAMMA AND/OR HARD X-RAY RADIATION DETECTOR

FIELD

The embodiments discussed herein are related to a wireless gamma and/or hard X-ray radiation detector.

BACKGROUND

Unless otherwise indicated herein, the materials described herein are not prior art to the claims in the present application and are not admitted to be prior art by inclusion in this section.

Detection of gamma and/or hard X-ray radiation with ultra-high speed circuits is a major challenge. Existing gamma and/or hard X-ray radiation detection devices suffer from slow response time, ultra-high bias voltage, after glow, and/or other problems. As used herein, the term "hard X-ray" may include any X-ray with energy in a range from 50 to 120 kiloelectronvolts (keV) of energy.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example embodiment, a wireless gamma and/or hard X-ray radiation detector includes a bulk semiconductor crystal, electrical contacts, a bias circuit, and a terahertz (THz) electromagnetic (EM) wave receiver. The bulk semiconductor crystal includes indium antimonide (InSb), cadmium telluride (CdTe), or cadmium zinc telluride (CdZnTe). The electrical contacts are coupled to two facets of the bulk semiconductor crystal. The bias circuit is electrically coupled to the bulk semiconductor crystal through the electrical contacts. The THz EM wave receiver is positioned to detect THz radiation emitted by the bulk semiconductor crystal.

In another example embodiment, a gamma and/or hard X-ray detector system includes an array of wireless gamma and/or hard X-ray radiation detectors. Each of the wireless gamma and/or hard X-ray radiation detectors in the array includes a bulk semiconductor crystal, electrical contacts, a bias circuit, and a THz EM wave receiver. The bulk semiconductor crystal includes indium antimonide (InSb), cadmium telluride (CdTe), or cadmium zinc telluride (CdZnTe). The electrical contacts are coupled to two facets of the bulk semiconductor crystal. The bias circuit is electrically coupled to the bulk semiconductor crystal through the electrical contacts. The THz EM wave receiver is positioned to detect THz radiation emitted by the bulk semiconductor crystal.

In another example embodiment, a wireless gamma and/or hard X-ray radiation detector includes a bulk InSb semiconductor crystal, a metal coating, an hermetic enclosure, xenon gas, a thermoelectric cooler (TEC), a temperature sensor, a TEC controller, an external heat sink, low thermal conductivity electrical contacts, a bias circuit, a THz EM wave receiver, and an event detector circuit. The bulk InSb semiconductor crystal is configured to emit THz radiation in response to absorption of gamma and/or hard X-ray radiation. The metal coating is formed on multiple sides of the bulk InSb semiconductor crystal. The hermetic enclosure surrounds the bulk InSb semiconductor crystal. The xenon gas is disposed within the hermetic enclosure. The hermetic enclosure and the xenon gas are configured to thermally isolate the bulk InSb semiconductor crystal from an external environment. The TEC is positioned within the hermetic enclosure and is thermally coupled to the bulk InSb semiconductor crystal. The temperature sensor is positioned within the hermetic enclosure and is thermally coupled to the bulk InSb semiconductor crystal. The TEC controller is communicatively coupled to the TEC and the temperature sensor and is configured to control a temperature of the TEC and the bulk InSb semiconductor crystal based on a temperature signal from the temperature sensor. The external heat sink is positioned outside the hermetic enclosure and is thermally coupled to the TEC through the hermetic enclosure. The low thermal conductivity electrical contacts are coupled to two or more facets of the bulk InSb semiconductor crystal. The bias circuit is electrically coupled to the bulk InSb semiconductor crystal through the low thermal conductivity electrical contacts and is configured to apply a bias voltage to the bulk InSb semiconductor crystal through the low thermal conductivity electrical contacts to generate an electric field within the bulk InSb semiconductor crystal. The THz EM wave receiver is positioned outside the hermetic enclosure to detect THz radiation emitted by the bulk InSb semiconductor crystal. The event detector circuit is coupled to the THz EM wave receiver and is configured to detect gamma and/or hard X-ray radiation absorption events/pulses based on a THz radiation detection signal output by the THz EM wave receiver to the event detector circuit. The bias circuit is coupled to a voltage supply and includes a current limiting resistor coupled in series between the voltage supply and one of the low thermal conductivity electrical contacts. The bias circuit is configured to supply a DC bias to the bulk InSb semiconductor crystal of less than 2 volts. The hermetic enclosure includes a metallized coating and a non-metallized aperture formed in the metallized coating. The THz EM wave receiver is aligned to the non-metallized aperture. The hermetic enclosure forms a resonant cavity to enhance amplitude of the THz radiation received at the antenna/receiver.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 7A and 7B include partially exploded views of other example THz radiation generators;

DETAILED DESCRIPTION OF SOME EXAMPLE EMBODIMENTS

Figure 1:
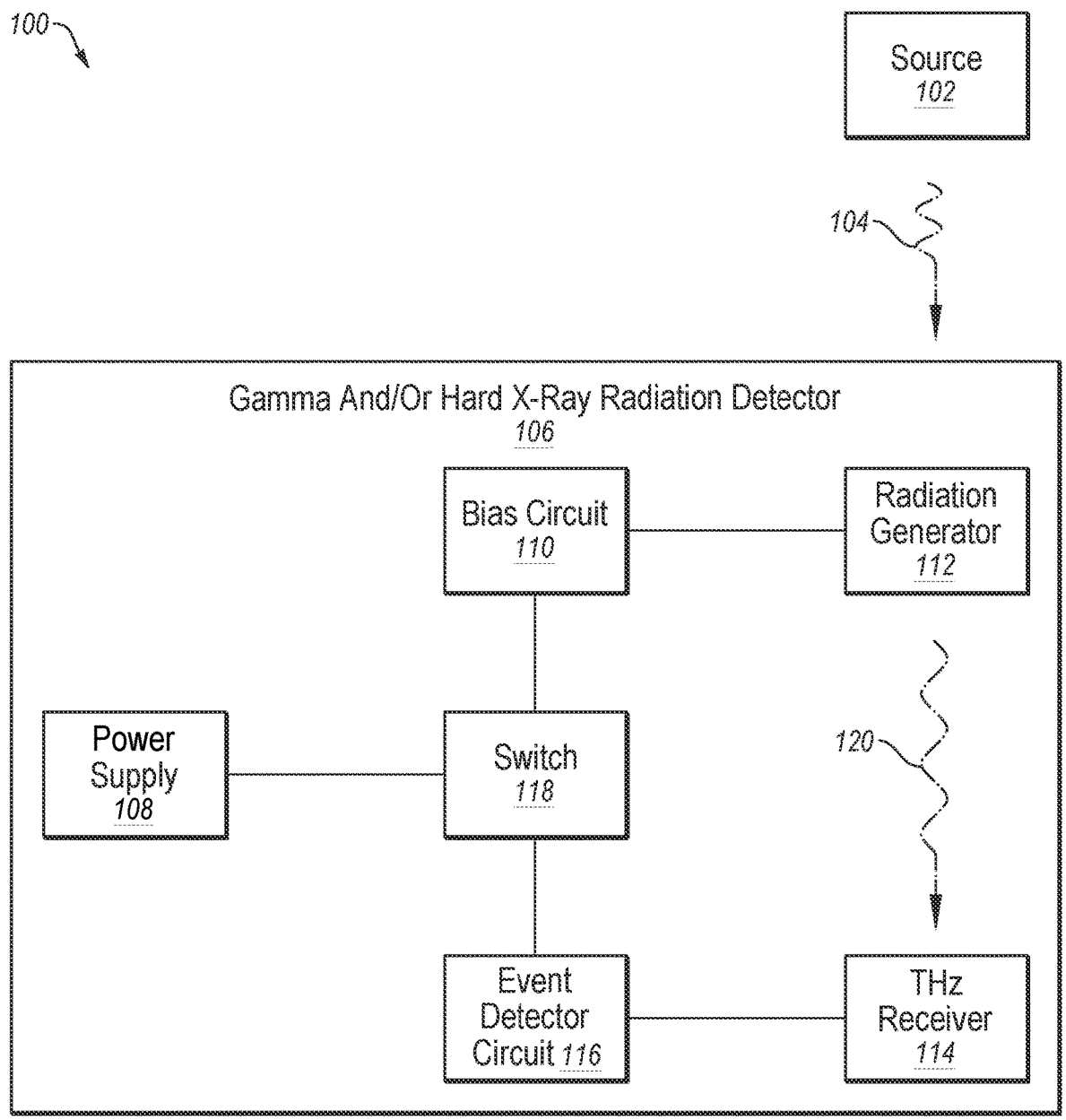
FIG. 1 is a block diagram of an example operating environment that includes a source of gamma and/or hard X-ray radiation and a wireless gamma and/or hard X-ray radiation detector.

Some gamma and/or hard X-ray radiation detection devices are based on and include Cadmium Telluride (CdTe) operated in a photoconductive mode. CdTe and other semiconductor-based photodetectors that operate in a photoconductive mode typically have a p-n junction that converts incoming radiation to electric current, often referred to as photocurrent. CdTe-based gamma and/or hard X-ray radiation detection devices have low carrier mobility, e.g., 1,100 centimeters squared per volt second ($cm^2/(V \cdot s)$), and require ultra-high bias voltage, e.g., up to 1,500 Volts for a CdTe crystal having a volume of about 1 cubic centimeter ($cm^3$). Other gamma and/or hard X-ray radiation detectors include scintillation crystals and photomultipliers which suffer from slow response time, a long fall time or tail, and after glow limits. In some embodiments, a bulk detector volume, e.g., of 5 millimeters cubed ($mm^3$) up to 1 $cm^3$ may guarantee absorption of high energy radiation such as gamma and/or hard X-ray radiation. A larger bulk detector volume, e.g., greater than 1 $cm^3$, may imply large electrodes (large capacitance, resistance, inductance, all detrimental to high-speed operations), and transit-limited diffusion effects which work against high frequency operations.

In photoconductive detector operations, photocurrent is measured as a measure of the gamma and/or hard X-ray radiation and electronic transport is the method of choice in detection electronics. Electronic transport includes drift, RC limited, diffusion limited and generation recombination contributions to the rise/fall time of the detector. However, the actual radiation absorption and electronic conversion occurs at a much faster rate than the time it takes for electronic transport to deliver the electronic signals to an electronic conduction detection circuit.

Instead of relying on electrical or optical (scintillation) detection, some embodiments herein utilize ultra-high frequency electromagnetic radiation emitted from accelerating ultra-high-speed bulk semiconductor carriers in a bulk semiconductor crystal. Rather than operating the bulk semiconductor crystal in photoconductive mode, some embodiments expose the bulk semiconductor crystal to incoming gamma radiation and/or hard X-ray radiation which excites bulk semiconductor electrons/holes thru impact ionization. As used herein, "gamma radiation" refers to one or more gamma rays or photons each with energy above 100 keV, while "hard X-ray radiation" refers to one or more X-rays or photons each with energy in a range from 50 to 120 keV. Moreover, the term "gamma and/or X-ray radiation" as used herein may include gamma radiation alone, X-ray radiation alone, or both gamma radiation and X-ray radiation. Thus, a gamma and/or X-ray radiation detector may detect gamma radiation alone, X-ray radiation alone, or both gamma radiation and X-ray radiation.

The massive energy transfer then accelerates primarily electrons (in InSb) with incredibly high mobility (e.g., $>1 \times 10^5$ $cm^2/v.sec$ (at 200 K), super small effective mass) which causes the highly energetic/accelerated bulk semiconductor carriers (primarily electrons) to emit ultra-high frequency electromagnetic radiation while being accelerated, specifically terahertz (THz) radiation in some embodiments. The THz radiation may then be detected by a THz antenna/integrated receiver, referred to herein as a THz EM wave receiver. The bulk semiconductor crystal may include InSb biased at two volts or less but at very low temperature (e.g., −60 to −80° C.). In other embodiments, the bulk semiconductor crystal may include CdTe, and/or cadmium zinc telluride (CdznTe) biased at higher voltage, such as 1,500 volts or more (at room temperature).

The present embodiments bypass electronic transport response time limitations and may combine the ultra-high speed response of InSb along with ultra-high speed signal processing of high-electron-mobility transistor (HEMT)/heterojunction bipolar transistor (HBT) mixed signal amplification and data processing technologies to form an ultra-high speed gamma and/or hard X-ray radiation pulse detection system. In some embodiments, the HEMT may include gallium arsenide (GaAs) metal oxide semiconductor HEMT (MOSHEMT) and/or the HBT may include epitaxial base link silicon germanium (SiGe) HBT.

The charge acceleration and mean free path of electrons within the bulk semiconductor crystal according to embodiments herein may be quite limited, e.g., in fractions of picoseconds, which may translate to THz radiation being emitted by bulk semiconductor carriers in the bulk semiconductor crystal. As used herein, THz radiation may include electromagnetic radiation with frequencies in the range from 0.1 THz to 1 THz or more, such as 3 THz. As previously indicated, the bulk semiconductor crystal may include InSb. InSb has near identical atomic number and mass density to CdTe, which is commonly used in photoconductive mode as a gamma ray and/or hard X-ray radiation detector. However, InSb has higher electron mobility, higher electron saturation velocity, a smaller effective electron mass, and a larger ratio between electron/hole mobility amongst all semiconductors. These combined effects make InSb an ideal candidate for both gamma and/or hard X-ray radiation detection as well as THz radiation emission.

Accordingly, some embodiments herein relate to a wireless gamma and/or hard X-ray radiation detector that is manufacturable, relies on accessible semiconductor technology, and is extremely fast and sensitive.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1 is a block diagram of an example operating environment 100 that includes a source 102 of radiation 104 and a wireless gamma and/or hard X-ray radiation detector 106 (hereinafter "detector 106"), arranged in accordance with at least one embodiment described herein. The source 102 may include a natural or artificial source of gamma and/or hard X-ray radiation. For instance, the source 102 may include any one or more of a radioisotope (e.g., the radioisotopes found in the natural radiation decay series of uranium, thorium, and actinium, the radioisotope potassium-40, the radioisotope carbon-14), a nuclear reactor, an imaging device (e.g., X-ray machine, computed tomography (CT) scanner), positron emission tomography (PET) scanner or other PET setup, or the like.

In some embodiments, the detector 106 may be configured to perform peak detection and timing measurements of gamma and/or hard X-ray pulses or bursts 104. The detector 106 may include and/or be coupled to a power supply 108, a bias circuit 110, a THz radiation generator 112, and a THz EM wave receiver 114. Optionally, the detector 106 may further include one or more of an event detector circuit 116, a switch 118, and/or other components or devices.

The bias circuit 110 may bias the THz radiation generator 112 to generate an electric field within a bulk semiconductor crystal of the THz radiation generator 112. The bulk semiconductor crystal may include InSb, CdTe, CdZnTe, or other semiconductor material configured, when biased at a suitable bias voltage, to emit THz radiation 120 in response to absorption of gamma and/or hard X-ray radiation inside the bulk semiconductor crystal. The bias voltage may be relatively lower for some bulk semiconductor crystals than others. For example, the bias voltage may be less than two volts when the bulk semiconductor crystal includes InSb and much higher, e.g., 1,000 volts or higher or even 1,500 volts or higher, when the bulk semiconductor crystal includes CdTe or CdZnTe.

In operation, the gamma and/or hard X-ray radiation that penetrates the bulk semiconductor may be absorbed by the bulk semiconductor crystal with sufficient volume (absorption length)(e.g., volume of 1 cm$^3$), generating within the bulk semiconductor crystal electron-hole pairs with high energy. At 300 kelvin (K), InSb as the bulk semiconductor crystal has an energy bandgap of 0.17 electron volts (eV). The number of electron-hole pairs N generated in a gamma ray photoelectric absorption event at 511 keV may be determined by dividing the energy (e.g., 511 keV) by the bandgap energy (e.g., 0.17 eV), resulting in a maximum number of electron-hole pairs of approximately 3,005,882 electron-hole pairs.

Each of the high energy electron-hole pairs may be accelerated by the energy absorbed as well as by an external electric field (e.g., the electric field applied to the bulk semiconductor crystal by the bias circuit 110). Each electron-hole pair thus accelerated may travel a distance, referred to as the ballistic length, before colliding with lattice of the bulk semiconductor crystal and knocking out more electrons and/or holes (generically hereinafter "carriers"). The new carriers may in turn be accelerated (e.g., by the electric field). Electrons within the bulk semiconductor crystal may have electron velocities less than an electron saturation velocity of the bulk semiconductor crystal. In the case of InSb, the bulk semiconductor crystal may have an electron saturation velocity of 5×10$^7$ centimeters (cm)/second (s)

A ballistic length through which each electron is accelerated before hitting and creating more energetic carriers and causing them to accelerate may be relatively small, such as in the micrometer range at most, e.g., 1-2 micrometers or less. A large number of carriers may be accelerated by the electric field applied to the bulk semiconductor crystal. As a result, a frequency of the radiation emitted from carriers knocking out more carriers from the lattice may be high given the velocity and the short distance traveled by carriers before creating more carriers. The process of radiation emission from super accelerated charged carriers traveling in the same direction with ultrashort duration (e.g., less than 1 picosecond) between occurrences may lead to radiation with frequencies in the THz range.

The THz radiation 120 emitted from accelerated carriers while knocking out more accelerated carriers from the lattice may be significant. In some embodiments, millions of electrons may be knocked out from the lattice in response to a gamma and/or hard X-ray radiation event due to, e.g., impact ionization given the velocity and the short distance they travel before creating more accelerated carriers.

The super high energy (e.g., >50 keV for gamma rays induced impact ionization carriers), ultrafast (e.g., >10$^4$ cm/sec velocity) streaks of avalanche electrons and to a lesser effectiveness holes generated by impact ionization following gamma ray and/or hard X-ray absorption may be accelerated and swept across by the applied electric field while knocking out more carriers with energy greater than 100 keV. The accelerating charges, which may accelerate from 0 to >1×10$^4$ cm/s or more within picosecond time scale may slow down due to scattering and interaction with lattice but they may radiate energy in the form of THz radiation 120 when the bulk semiconductor crystal as InSb is maintained in a temperature range of 77K-200K due to the acceleration and carrier velocities in this temperature range. The THz radiation 120 propagates at its peak value in a direction perpendicular to the direction of the applied external bias electric field (direction of travel of accelerated carriers) applied to the bulk semiconductor crystal. The THz radiation 120 generated in the bulk semiconductor crystal of the radiation generator 112 will have little interaction with non-ionized bulk atoms in the bulk semiconductor crystal as it traverses to the outside. The energy of THz radiation 120 is too small to ionize atoms in the bulk semiconductor crystal of the radiation generator 112.

There are a number of factors which may reduce the acceleration of electrons and to a lesser extent holes during gamma ray/hard X-ray induced carrier generation and impact ionization. Such factors may include one or more of: Coulomb screening, Coulomb scattering, bulk plasmon interaction, electron-electron scattering, electron-phonon scattering, polar/non optical phonons, scattering from lattice and impurity ions, intervalley scattering, ionized/non-ionized impurity scattering, Shockley-Reed Hall recombination, piezoelectric, and eventual thermalization. Some of the foregoing factors and their effect on the acceleration of electrons in the bulk semiconductor crystal will now be discussed.

The reduction in external electric field due to Coulomb screening potential of charge clouds generated by the impact ionization will reduce the duration of the radiation emitted from carriers as they lose their momentum.

The electrostatic potential responsible for external electric field is dramatically reduced by the charge cloud according to Equations 1 and 2:

$$\phi(r) = (e/4\pi\varepsilon_0 r)^*(\exp(-r/\lambda_{TF})) \quad \text{Equation 1.}$$

$$\lambda_{TF} = (\sqrt{(2k\varepsilon_0 E_F/3n_0 e^2)}) = \text{Debye length(perFermi-Thomas model)} \quad \text{Equation 2.}$$

In Equation 1, $\phi(r)$ is screened potential as function of radial distance r, e is electron charge, $\pi$ is the mathematical constant pi (e.g., approximately equal to 3.14159), co is vacuum permittivity, r is radial distance, and $\lambda_{TF}$ is the Debye length according to Equation 2. In Equation 2, k is Boltzmann's constant, $E_F$ is fermi energy, and no is crystal carrier neutral doping density. As indicated by Equations 1 and 2, the external electric field effectiveness drops rapidly as a charge cloud forms after impact ionization. As more carriers are accelerated by initial impact ionization; the next set of generated carriers will lose their acceleration due to the drop in electric field arising from Coulomb screening.

In a photoconductive detector operating in a photoconductive mode, the Coulomb screening would be considered a major setback as it degrades the speed of response of the detector. According to embodiments herein, the Coulomb screening is advantageous as it facilitates rapid response to absorption of short and frequent nuclear radiation incidents and successive waves of carrier acceleration and radiation with approximately picosecond or more delays between gamma and/or hard X-ray radiation events. The screening potential helps to stop a long tail in response by reducing the acceleration of latent impact ionization carriers. The THz EM wave receiver 114 may be designed to operate over a well-defined range of frequencies and may not detect low frequency (e.g., <20 GHz radiation) after the gamma ray or hard X-ray signal ends. This feature may help preserve timing resolution and energy resolution between signals. In some embodiments, calibration may be implemented for the THz EM wave receiver 114 to discriminate between gamma and/or hard X-ray radiation energy and timing between bursts so the THz EM wave receiver 114 can correctly discriminate between signals.

When the bulk semiconductor crystal of the THz radiation generator 112 is implemented as InSb, the small impact ionization threshold energy, carrier ballistic length, extremely high carrier velocity (mobility), very low effective mass, short relaxation time, and scattering for InSb may all work together to improve the response of the detector 106 compared to other gamma and/or hard X-ray radiation detectors.

In photoconductive detector operation, the fall time tail response in pulse of the photocurrent due to diffusion and RC limited response times of carriers may be a concern because it may impede the effect of transit time in the speed of response of the photoconductive detector and its resolution. Some embodiments herein may take advantage of the rapid (e.g., within picosecond range) generation and extinguishing electromagnetic radiation impulses which form a high frequency EM wave in THz region of frequency. Accordingly, some embodiments herein may be efficient in detecting the onset of gamma and/or hard X-ray radiation absorption which may help increase the speed of response of the detector 106.

In photoconductive detector operation, radiation-induced photocurrent is detected by the photoconductive detector. Shot noise, thermal (Johnson) noise, diffusion and RC limited response times all adversely affect the performance of the photoconductive detector. Some embodiments of the detector 106 herein include InSb, e.g., in the THz radiation generator 112. InSb has a very small band gap energy (0.17 eV at 300 K) which does not allow it to be a suitable photoconductive detector at moderate temperatures due to Johnson noise, phonon scattering, and other factors. However, InSb has high carrier mobility, large contrast between electron and hole effective mass, and short carrier life time. For example, InSb at 300K has electron mobility $\mu_e$ of 77,000 cm$^2$/(V·s) (compared to 1,100 cm$^2$/(V·s) for CdTe), hole mobility $\mu_h$ of 1,200 cm$^2$/(V·s) (compared to 90 cm$^2$/(V·s) for CdTe), an electron lifetime $T_e$ of 1 microsecond, a hole lifetime $\tau_h$ of 300 nanoseconds, electron effective mass (me/m0) of 0.014 (compared to 0.1 for CdTe), hole effective mass (mh/m0) of 0.43 (compared to 0.4 for CdTe) and significantly better effective electron and hole mass than CdTe. The ability of InSb to respond to ultra-fast photoexcitation (e.g., greater than 100 GHz) is unique. According to some embodiments herein, photoconductive current detection is not used and low energy types of interactions and their adverse effects in electronic pulse detection are bypassed.

Figure 2:
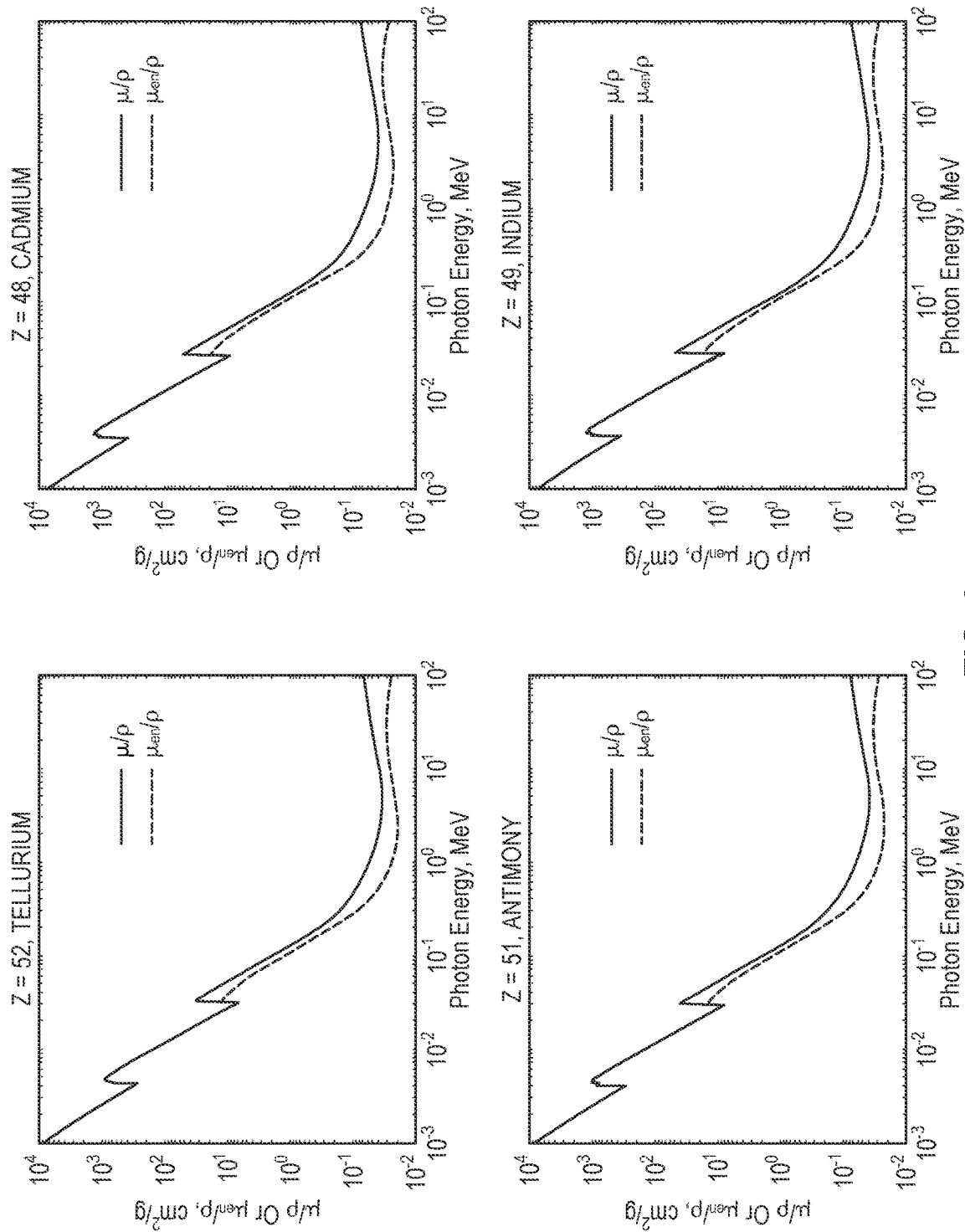
FIG. 2 illustrates comparative side-by-side mass attenuation coefficients for cadmium (Cd), tellurium (Te), indium (In), and antimony (Sb)

Compared to CdTe, InSb has near identical atomic number (49/51 for InSb and 48/52 for CdTe), mass attenuation coefficients (see FIG. 2) (needed for radiation absorption), and density (5.77 grams per cubic centimeter (g/cm$^3$) for InSb and 5.85 g/cm$^3$ for CdTe). FIG. 2 illustrates mass attenuation coefficients for Cd, Te, In, and Sb, arranged in accordance with at least one embodiment herein. The carrier mobility (at 300K: InSb $\mu_e$=77,000 cm$^2$/(V·s), CdTe $\mu_e$=1,100 cm$^2$/(V·s), InSb $\mu_h$=850 cm$^2$/(V·s), and CdTe $\mu_h$=90 cm$^2$/(V·s); at 200K: lightly doped InSb $\mu_e$>100000 cm$^2$/(V·s), CdTe $\mu_e$=1,500 cm$^2$/(V·s), InSb $\mu_h$=1,200 cm$^2$/(V·s), and CdTe $\mu_h$=150 cm$^2$/(V·s)) contrast between electron effective mass and hole effective mass (0.0326 for InSb and 0.25 for CdTe), mean free path length, and effective mass are more favorable for InSb than II-VI devices like CdTe. InSb's low energy bandgap of 0.17 eV requires cryogenic operation for photoconductive detector applications. However, that does not limit InSb's capabilities in impulse detection schemes and narrow frequency band detection schemes.

Figure 3:
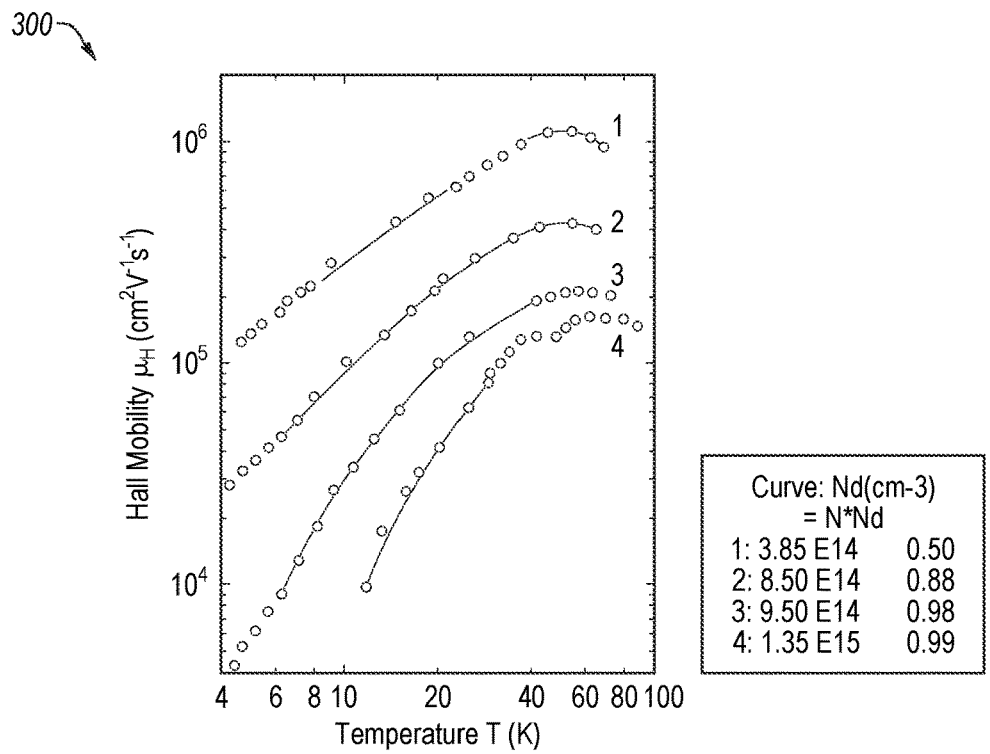
FIG. 3 is a graph of Hall Mobility versus temperature for different doping concentrations of n-type InSb.

FIG. 3 is a graph 300 of Hall Mobility versus temperature for different doping concentrations (using chromium as the dopant) of n-type InSb, arranged in accordance with at least one embodiment described herein. FIG. 3 includes a legend 302 showing the specific doping concentration associated with each of the four curves included in the graph 300. It can be seen from FIG. 3 that lower doping increases mobility.

Figure 4:
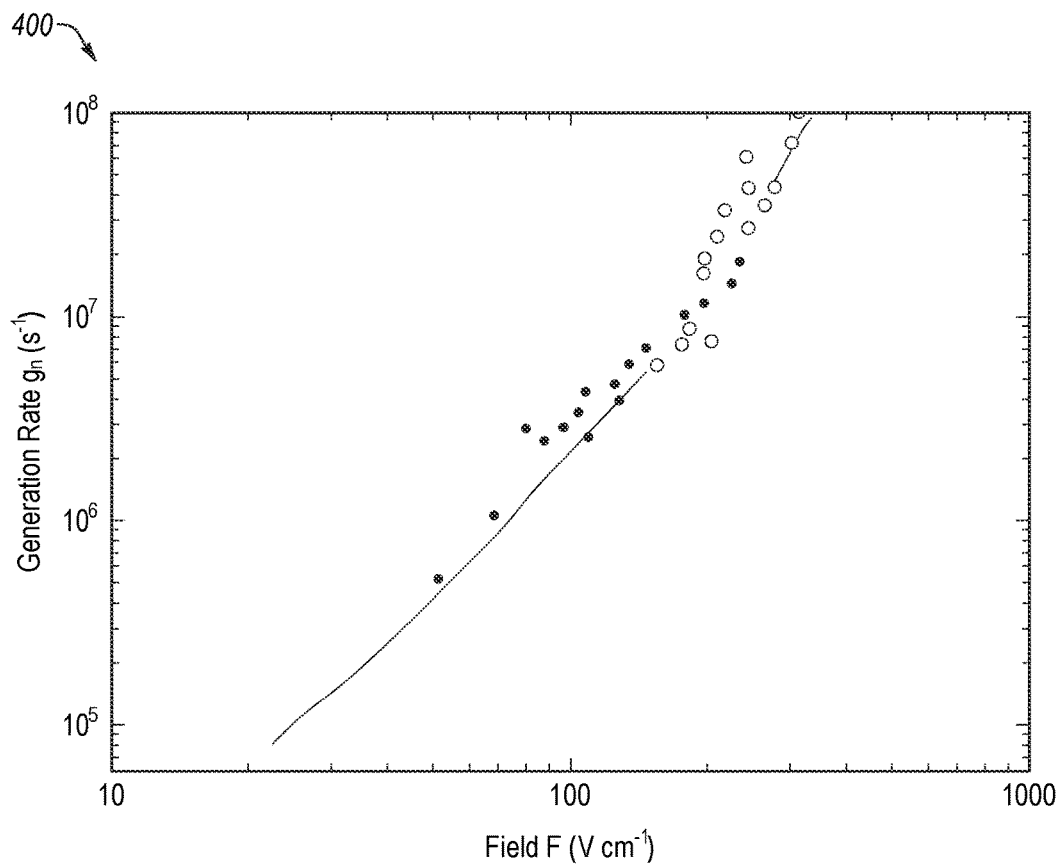
FIG. 4 is a graph of impact ionization in InSb as a function of electric field.

FIG. 4 is a graph 400 of impact ionization (or generation rate) in InSb as a function of electric field, arranged in accordance with at least one embodiment described herein. It can be seen from FIG. 4 that InSb is a very efficient device in generating impact ionization carriers, with ultra-high speeds unmatched by any other material for gamma and/or hard X-ray radiation detection due to its low band gap and low breakdown voltage.

In photoconductive gamma radiation detectors, the large size needed to guarantee detection of radiation absorption works against high speed photoconductive detector operation. Diffusion limited response time and electrode geometry (capacitance, resistance, inductance) degrade detector bandwidth. In embodiment herein, however, a large area detector does not impede the speed of response of accelerating electrons and radiation emission is not affected. Some embodiments do not depend on photocurrent vs. dark current (e.g., in the meV range). Instead, some embodiments herein depend on extremely fast carrier acceleration, large numbers and short lived phenomena. THz emission from bulk as a result of carrier acceleration is our method of operation. There will be losses and not all THz radiation photons are detected.

Conversion efficiency from incident gamma and/or hard X-ray radiation to EM THz radiation. Besides mass attenuation coefficient/radiation absorption inefficiencies; the EM THz radiation waves generated by accelerating impact ionization carriers can suffer optical reflection losses at exit from bulk semiconductor to outside crystal due to mismatch in index of refraction.

Mismatch between optical index of refraction of InSb and xenon gas in enclosure can cause optical losses for electromagnetic radiation exiting the crystal. However, the EM THz radiation emission is most dominant at 90 degrees or perpendicular to direction of carrier acceleration along the bias field. The direction of radiation being 90° to surface of the bulk semiconductor crystal reduces reflection losses.

Figure 5:
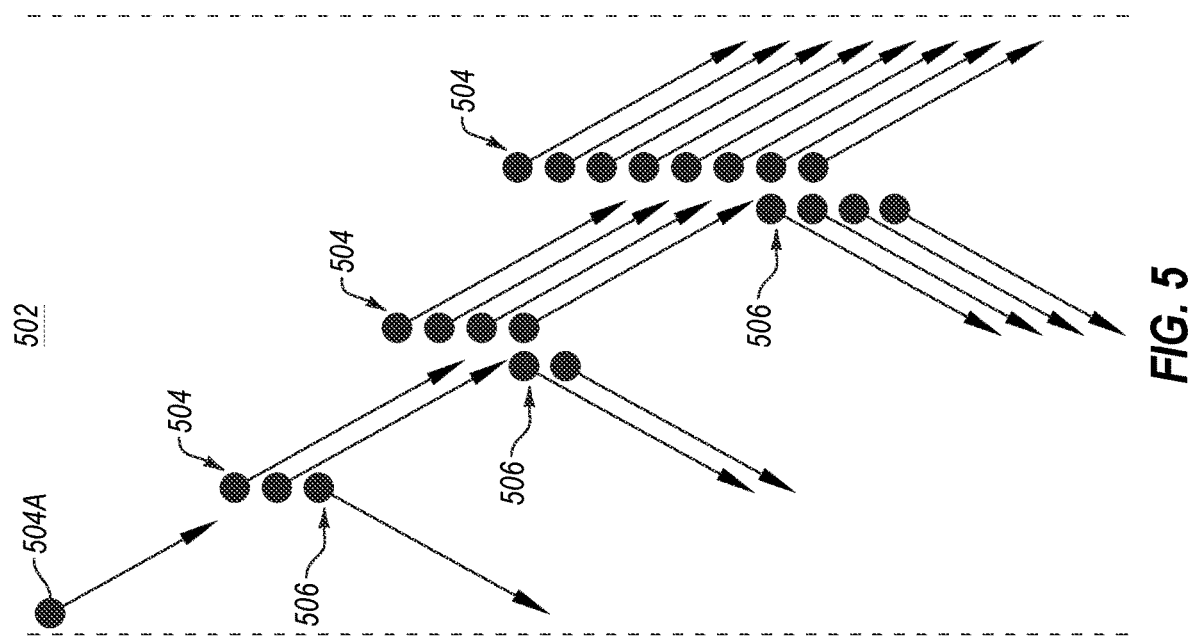
FIG. 5 illustrates a portion of an example bulk semiconductor crystal in a THz radiation generator of FIG. 1.

FIG. 5 illustrates a portion of an example bulk semiconductor crystal 502 in the THz radiation generator 112 of FIG. 1, arranged in accordance with at least one embodiment herein. The bulk semiconductor crystal 502 may include InSb or other suitable bulk semiconductor crystal. In operation, absorption of gamma and/or hard X-ray radiation frees high-energy carriers, e.g., electron-hole pairs, from lattice of the bulk semiconductor crystal 502 and an applied electric field (left to right in FIG. 5) accelerates the carriers. The high-energy carriers include electrons 504 and holes 506. An electron 504A is an example of one of the carriers that may be freed by absorption of the gamma and/or hard X-ray radiation. Under the applied electric field in this example, electrons 504 may be accelerated to the right and holes 506 may be accelerated to the left. The accelerated carriers 504, 506 knock out other carriers, creating an avalanche effect as depicted in FIG. 5.

The THz radiation is generated by and during the acceleration of moving charges. The acceleration of charges may be over a relatively small distance mean free path in the micrometer range, which may occur for durations of fractions of a picosecond for InSb which has electron mobility of $>1\times10^5$ cm$^2$/(V-s) at 200 K. Due to the applied electric field and impact ionization, there will be a cluster of charges in the bulk semiconductor crystal all accelerating and moving in the direction of the applied electric field. Due to a ballistic length less than one micrometer and an electron saturation velocity in InSb with absolute maximum value of $5\times10^7$ cm/s, there may be a sub picosecond repetition rate between carrier acceleration events due to impact ionization events as carriers with greater than 50 keV free many more carriers which in turn accelerate in the same order of time. Given the sub picosecond repetition rate, the resulting EM wave front from the accelerated carriers may have a THz frequency. The EM wave front may die down as there is a slowdown of carriers generated by the original event.

The frequency of the radiation emitted from the bulk semiconductor crystal may be in the THz range due to the short-lived nature of acceleration of super-fast carriers being generated and swept in clusters all initiated by absorption of gamma and/or hard X-ray radiation thru photoelectric process. Compton scattering and pair production for gamma and/or hard X-ray radiation with energy greater than 0.7 MeV can also induce a similar response.

The accelerating charges will slow down quickly due to Coulomb screening, scattering and interaction with the lattice of the bulk semiconductor crystal. Charge scattering, recombination, eventual thermalization, and/or other factors may quickly extinguish the emission of THz radiation thru carrier deceleration.

Figure 6:
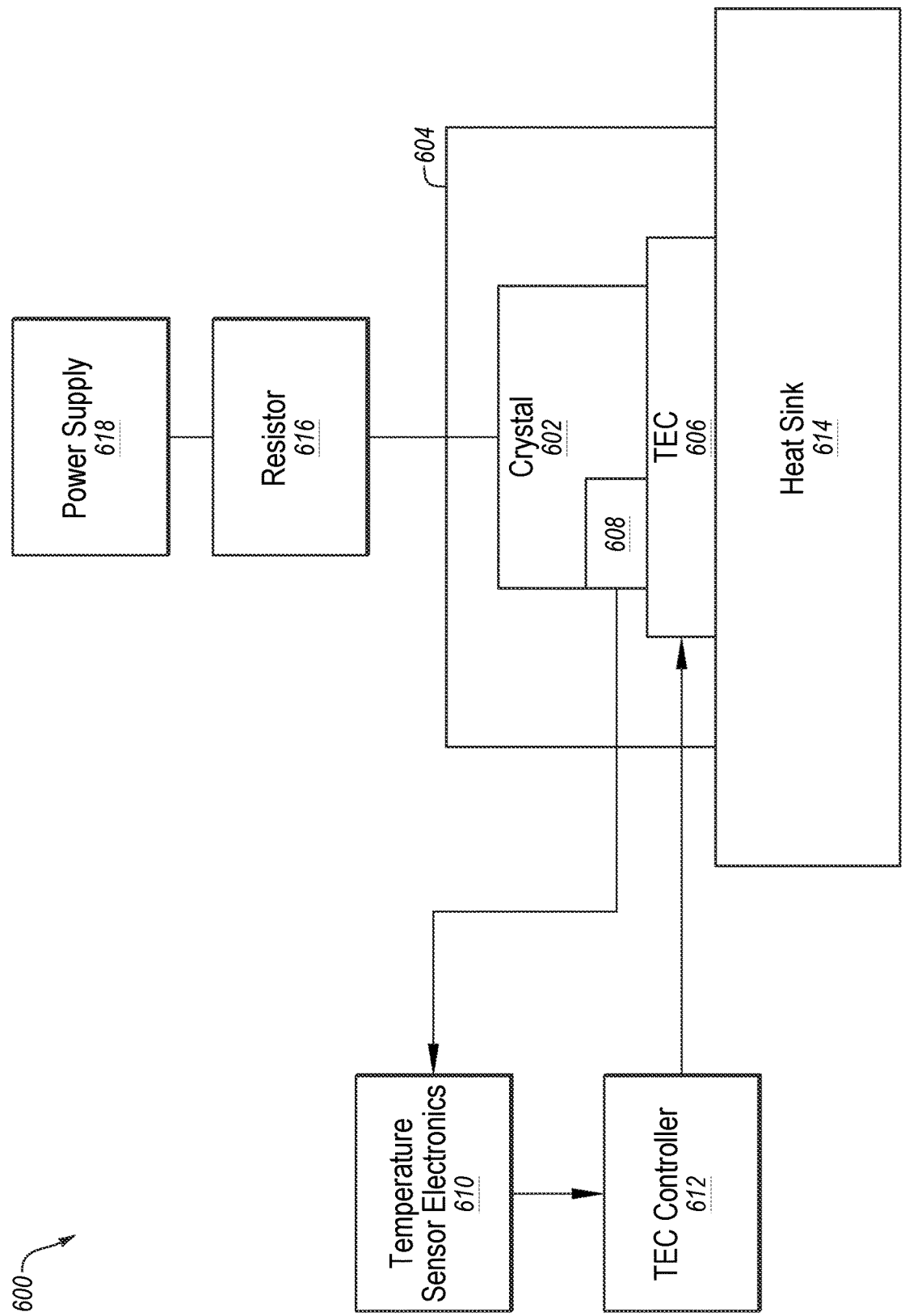
FIG. 6 is a block diagram of an example THz radiation generator that may be included in the wireless gamma and/or hard X-ray radiation detector of FIG. 1.

FIG. 6 is a block diagram of an example THz radiation generator 600, arranged in accordance with at least one embodiment described herein. The THz radiation generator 600 may include, be included in, or correspond to other THz radiation generators described herein, such as the THz radiation generator 112 of FIG. 1.

In general, the THz radiation generator 600 may include a bulk semiconductor crystal 602 of InSb or other suitable semiconductor crystal. The bulk semiconductor crystal 602 may be positioned within an hermetic enclosure 604 and thermally coupled to a thermoelectric cooler (TEC) 606 that is also positioned within the hermetic enclosure 604. In some embodiments, the hermetic enclosure 604 may be filled with xenon gas and/or other gas with low thermal conductivity. A temperature sensor 608 may be thermally coupled to the bulk semiconductor crystal 602 within the hermetic enclosure 604 to detect a temperature of the bulk semiconductor crystal 602. The temperature sensor 608 may be communicatively coupled through the hermetic enclosure 604 to temperature sensor electronics 610 and a TEC controller 612. The TEC controller 612 may be communicatively coupled through the hermetic enclosure 604 to the TEC 606. The TEC controller 612 may increase or decrease cooling of the TEC 606 according to a temperature control algorithm, e.g., based on a temperature setpoint and a temperature signal from the temperature sensor electronics 610 and the temperature sensor 608. In some embodiments, the temperature setpoint may be 200 K or other temperature setpoint. The TEC 606 may be thermally coupled through the hermetic enclosure 604 to an external heat sink 614 to sink heat from the TEC 606 to the external heat sink 614. The external heat sink 614 may include an air-cooled heat sink, a liquid-cooled heat sink, or other suitable heat sink.

A bias circuit may be electrically coupled through the hermetic enclosure 604 to the bulk semiconductor crystal 602, e.g., via electrical contacts (not shown in FIG. 6) coupled to two or more facets of the bulk semiconductor crystal 602. The bias circuit may include a resistor 616 coupled in series between a power supply 618 and the bulk semiconductor crystal 602. The resistor 616 may be coupled in series with a positive voltage supply line of the bias circuit and may function and/or be implemented as a current limiting resistor to ensure excessive current is not drawn. The resistor 616 may prevent the bulk semiconductor crystal 602 from entering breakdown mode by automatically reducing bias voltage in the event there is a large photocurrent generated by the bulk semiconductor crystal 602 during impact ionization after an ionization radiation detection event. In some embodiments, the resistor 616 may have a resistance of about 100 kilo-ohms (kΩ) or other suitable resistance. The resistor 616 helps ensure the THz radiation generator 600 does not reach break down voltage and excessive breakdown related current draw. The power supply 618 may include, be included in, and/or correspond to the power supply 108 of FIG. 1.

In some embodiments, the hermetic enclosure 604 may have one or more metallized coatings formed on one or more surfaces, or on at least a portion of each of one or more surfaces, of the hermetic enclosure 604. The one or more metallized coatings may include silver coating with flash gold for environmental protection and/or other suitable material. Alternatively, or additionally, the metallized coating may form within the hermetic enclosure 604 a resonant cavity, as described in more detail elsewhere herein. Alternatively, or additionally, the metallized coating may partially or completely shield the bulk semiconductor crystal 602 from infrared radiation, radio wave radiation, cosmic radiation, and/or other radiation that may be a source of noise in the detection of gamma and/or hard X-ray radiation. In some embodiments, the metallized coatings may be absent from a top surface of the hermetic enclosure 604, one or more sides of hermetic enclosure 604, or the like. More particularly, in some embodiments, the metallized coatings may be omitted (or formed and subsequently removed) from locations at which the THz EM wave receiver may be aligned to receive the THz radiation emitted by the bulk semiconductor crystal 602 responsive to absorption of gamma and/or hard X-ray radiation.

Figure 7A:
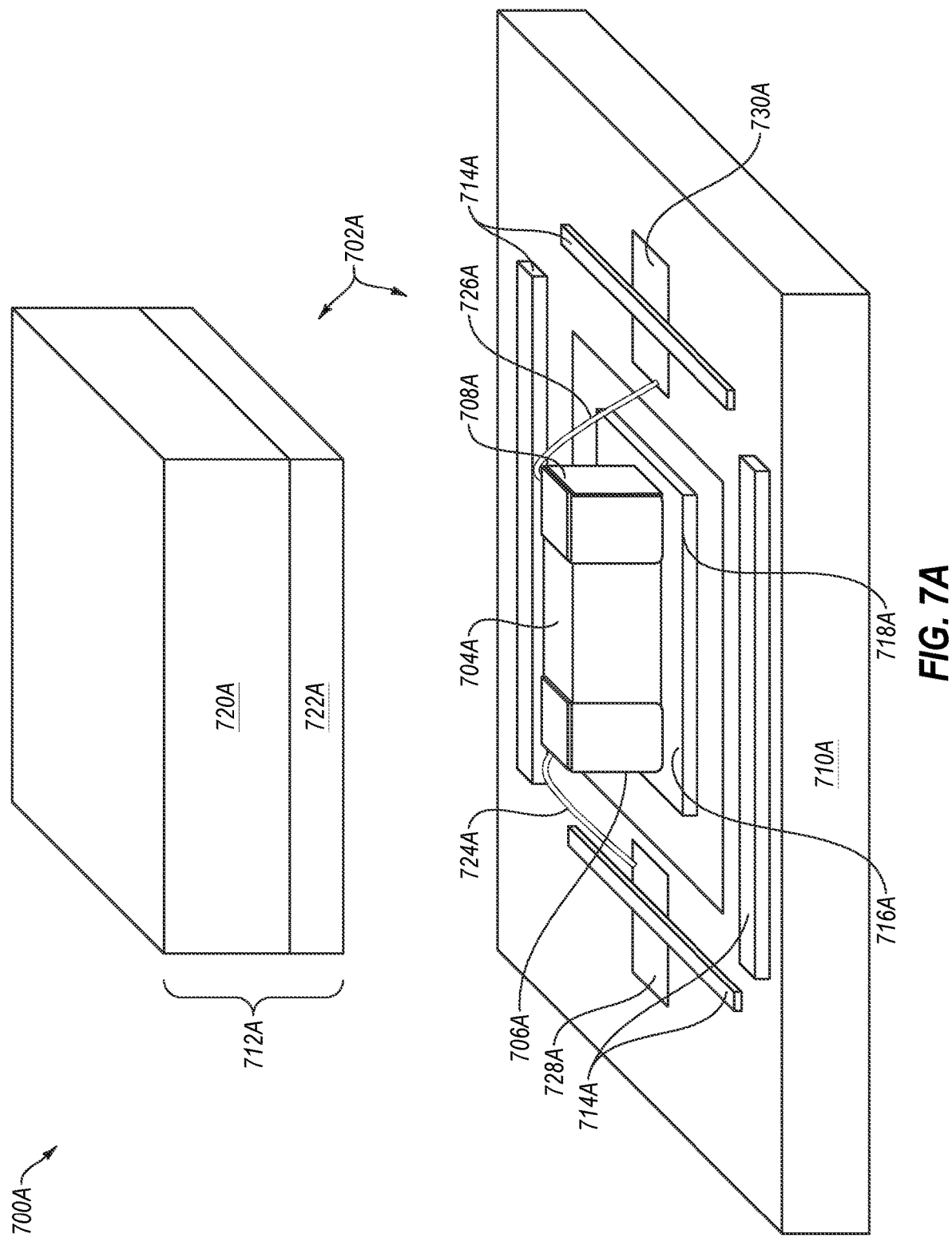

FIGS. 7A and 7B include partially exploded views of other example THz radiation generators 700A, 700B (hereinafter collectively "THz radiation generators 700" or generically "THz radiation generator 700"), arranged in accordance with at least one embodiment described herein. The THz radiation generators 700 may include, be included in, or correspond to other THz radiation generators described herein, such as the THz radiation generators 112, 600 of FIGS. 1 and 6. Each of the THz radiation generators 700 includes a hermetic enclosure 702A, 702B (hereinafter collectively "hermetic enclosures 702" or generically "hermetic enclosure 702"), within which is disposed a bulk semiconductor crystal 704A, 704B (hereinafter collectively "bulk semiconductor crystals 704" or generically "bulk semiconductor crystal 704"), having electrical contacts 706A, 706B, 708A, 708B (hereinafter collectively "electrical contacts 706, 708" or generically "electrical contact 706, 708"), coupled to two or more facets thereof.

The hermetic enclosure 702 may include, be included in, or correspond to the hermetic enclosure 604 of FIG. 6 or other hermetic enclosures described herein. Each of the hermetic enclosures 702 may include a base 710A, 710B (hereinafter collectively "bases 710" or genetically "base 710"), a top cover 712A, 712B (hereinafter collectively "top covers 712" or generically "top cover 712"), and a hermetic seal 714A, 714B (hereinafter collectively "hermetic seals 714" or generically "hermetic seal 714"). The bases 710 may include polystyrene or other suitable material. In some embodiments, each of the bases 710 may include a cavity or opening with a metal heat sink 716A, 716B (hereinafter collectively "metal heat sinks 716" or generically "metal heat sink 716") positioned in the cavity or opening. The bulk semiconductor crystal 704 may be thermally coupled to a top side or surface of the metal heat sink 716 through a corresponding TEC 718A, 718B (hereinafter collectively "TECs 718" or generically "TEC 718"). An opposite bottom side or surface of the metal heat sink 716 may be thermally coupled to a corresponding external heat sink such as the external heat sink 614 of FIG. 6. The metal heat sink 716 may thermally couple the TEC 718 through the hermetic enclosure 702 to the corresponding external heat sink.

The top covers 712 may include first portions 720A, 720B (hereinafter collectively "first portions 720" or generically "first portion 720") and/or second portions 722A, 722B (hereinafter collectively "second portions 722" or generically "second portion 722"). The first portions 720 may include glass, plexiglass, or other suitable material. The second portions 722 may include polystyrene or other low conductivity material. Polystyrene (or other suitable material) as the second portions isolates the TEC 718 from non temperature-controlled environment while providing mechanical base support for the apparatus. While the top cover 712 may be divided into a first portion 720 and a second portion 722 as illustrated, alternatively, the top cover 712 may be implemented as a single continuous structure.

In some embodiments, the base 710 and/or the top cover 712 may have one or more metallized coatings formed on one or more surfaces, or on at least a portion of each of one or more surfaces, of the base 710 and/or the top cover 712. The one or more metallized coatings may include silver with gold flash on top for protection or other suitable material. Alternatively, or additionally, the metallized coating may form within the hermetic enclosure 702 a resonant cavity, as described in more detail elsewhere herein. Alternatively, or additionally, the metallized coating on the enclosure may partially or completely shield the bulk semiconductor crystal 704 from infrared radiation, radio wave radiation, cosmic radiation, and/or other radiation that may be a source of noise in the detection of gamma and/or hard X-ray radiation. In some embodiments, the metallized coatings may be absent from a top surface of the top cover 712, one or more sides of the top cover 712, or the like. More particularly, in some embodiments, the metallized coatings may be omitted (or formed and subsequently removed) from locations at which the THz EM wave receiver may be aligned to receive the THz radiation emitted by the bulk semiconductor crystal 704 responsive to absorption of gamma and/or hard X-ray radiation.

The hermetic seal 714 may be configured to hermetically seal the top cover 712 to the base 710. The hermetic seal 714 may be divided into multiple discrete portions as illustrated in FIG. 7A or may be implemented as a single continuous seal as illustrated in FIG. 7B. Alternatively or additionally, the hermetic seal 714 may include a rubber gasket or other suitable material.

As illustrated in FIGS. 7A and 7B, the electrical contacts 706, 708 may be coupled to opposite ends of the bulk semiconductor crystal 704 and/or may form Schottky contacts. Each of the electrical contacts 706, 708 may include one or more of gold, graphene, InSb graphene, copper, nickel, indium aluminum antimonide (InAlSb), or other suitable material. Graphene may help eliminate or reduce adverse plasmonic effects that may arise from use of metal contacts at a surface or surfaces of the bulk semiconductor crystal 704. Application of a voltage to the electrical contacts 706, 708 may generate an electric field within the bulk semiconductor crystal 704 to accelerate carriers freed when gamma and/or hard X-ray radiation is absorbed. The electrical contacts 706, 708 may be electrically coupled to a bias circuit 110 and/or power supply 108, 618 through the hermetic enclosure 702 via one or more leads 724A, 724B, 726A, 726B, electrode contacts 728A, 728B, 730A, 730B, and/or other electrically conductive structures. In more detail, the electrical contact 706 may be electrically coupled to the bias circuit and/or power supply through the hermetic enclosure 702 via the lead 724A, 724B and the electrode contact 728A, 728B while the electrical contact 708 may be electrically coupled to the bias circuit and/or power supply through the hermetic enclosure 702 via the lead 726A, 726B and the electrode contact 730A, 730B.

Figure 8A:
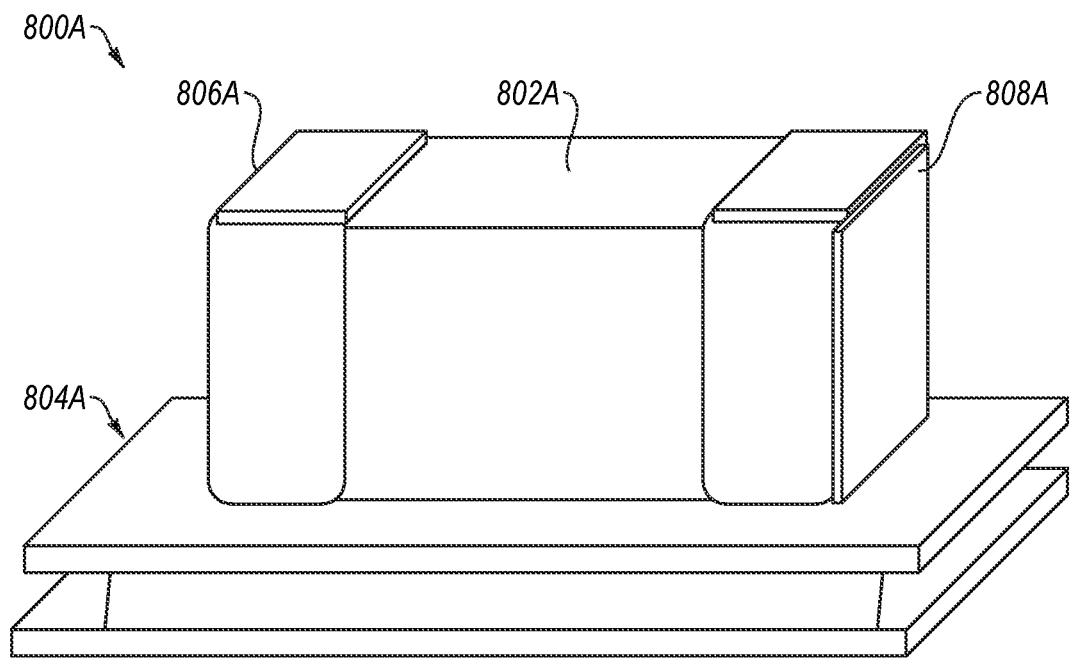
FIGS. 8A-8C illustrate various electrical contact configurations of a bulk semiconductor crystal.
Figure 8B:
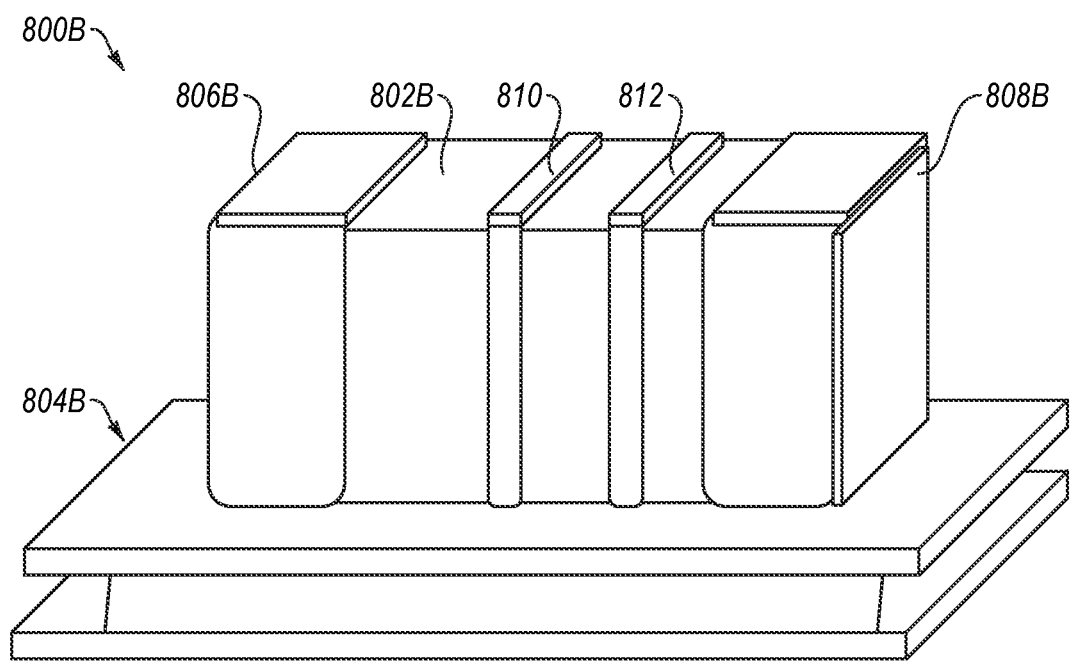
Figure 8C:
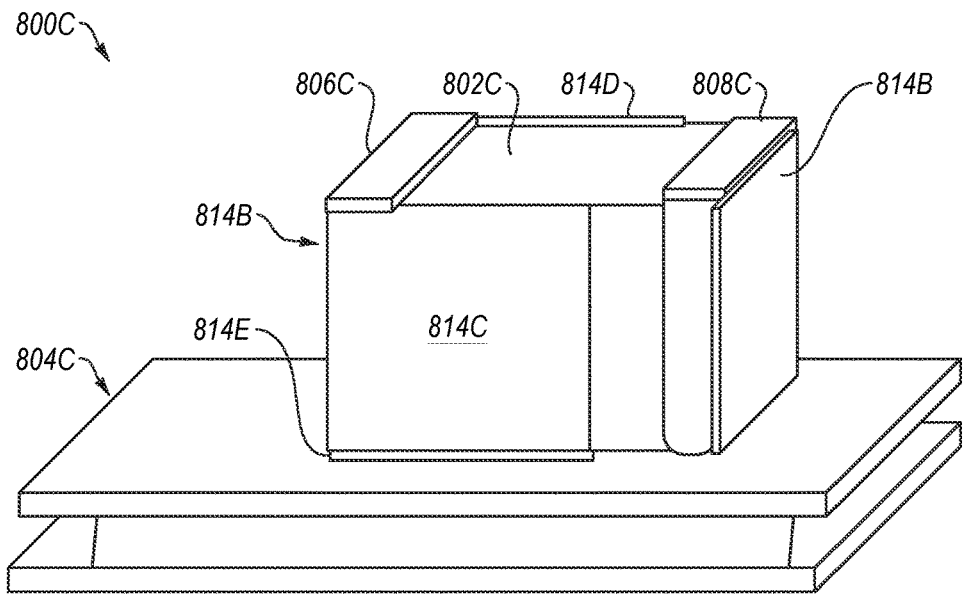

FIGS. 8A-8C illustrate various electrical contact configurations 800A, 800B, 800C (hereinafter collectively "configurations 800" or generically "configuration 800") of a bulk semiconductor crystal 802A, 802B, 802C (hereinafter collectively "bulk semiconductor crystals 802" or generically "bulk semiconductor crystal 802"), arranged in accordance with at least one embodiment described herein. The bulk semiconductor crystal 802 may include, be included in, or correspond to other bulk semiconductor crystals described herein, such as the bulk semiconductor crystals 602, 704 of FIGS. 6-7B. The bulk semiconductor crystal 802 is shown thermally coupled to a TEC 804A, 804B, 804C (hereinafter collectively "TECs 804" or generically "TEC 804"). Each TEC 804 may include a multi-stage Peltier cooler such as LAIRD THERMAL SYSTEMS' Multistage MS Series Thermoelectric Cooler (MS3-052-10-17-011-WSPVC multistage thermoelectric cooler) or other suitable TEC.

Each of the configurations 800 includes a first electrical contact 806A, 806B, 806C (hereinafter generically "first electrical contact 806") coupled to a first facet anchor end of the bulk semiconductor crystal 802 and a second electrical contact 808A, 808B, 808C (hereinafter generically "second electrical contact 808") coupled to a second facet and/or end of the bulk semiconductor crystal 802. The first electrical contact 806 may include, be included in, or correspond to other electrical contacts herein, such as the electrical contact 706 of FIGS. 7A-7B The second electrical contact 808 may include, be included in, or correspond to other electrical contacts herein, such as the electrical contact 708 of FIGS. 7A-7B. In some embodiments, the first electrical contact 806 is a negative voltage contact or negative terminal and the second electrical contact 808 is a positive voltage contact or positive terminal. In other embodiments, the first electrical contact 806 is the positive voltage contact or positive terminal and the second electrical contact 808 is the negative voltage contact or negative terminal.

The configuration 800B of FIG. 8B additionally includes first and second intermediate electrical contacts 810, 812 coupled to one or more facets of the bulk semiconductor crystal 802B between the first electrical contact 806B and the second electrical contact 808B. Application of a voltage to the first and second intermediate contacts 810, 812 may strengthen or otherwise enhance the electric field generated between the first and second electrical contacts 806B, 808B. In an example, a voltage of V+/4 (where V+ is the voltage applied to the second electrical contact 808B) may be applied to the first intermediate electrical contact 810 and a voltage of V+/2 may be applied to the second intermediate electrical contact 812.

The configuration 800C of FIG. 8C additionally includes one or more metallization coatings applied to one or more facets, or to one or more portions of one or more facets, of the bulk semiconductor crystal 802C. For example, in FIG. 8C, one end facet is completely covered by metallization coating 814A, the other end facet (not visible in FIG. 8C) is completely covered by another metallization coating 814B (not visible in FIG. 8C) a front facet is partially covered by metallization coating 814C, a rear facet (not visible in FIG. 8C) is partially covered by metallization coating 814D, and a bottom facet is partially covered by metallization coating 814E. The various metallization coatings 814A-814E may be generically referred to herein as "metallization coating 814". In some embodiments, some or all of the metallization coating 814 may include or be included in a corresponding one of the first or second electrical contacts 806C, 808C. The metallization coating may be gold or graphene for Shottky contact formation or other suitable material for electrically biasing the bulk semiconductor crystal 802.

Accordingly, metallized coatings may be applied to one or more surfaces, or on at least one portion of each of one or more surfaces, of a bulk semiconductor crystal of a THz radiation generator and/or to one or more surfaces, or on at least one portion of each of one or more surfaces, of a hermetic enclosure of the THz radiation generator. Metallized coatings on one or more surfaces, or on at least one portion of each of one or more surfaces, of the hermetic enclosure may form a resonant cavity within the hermetic enclosure.

Figure 9A:
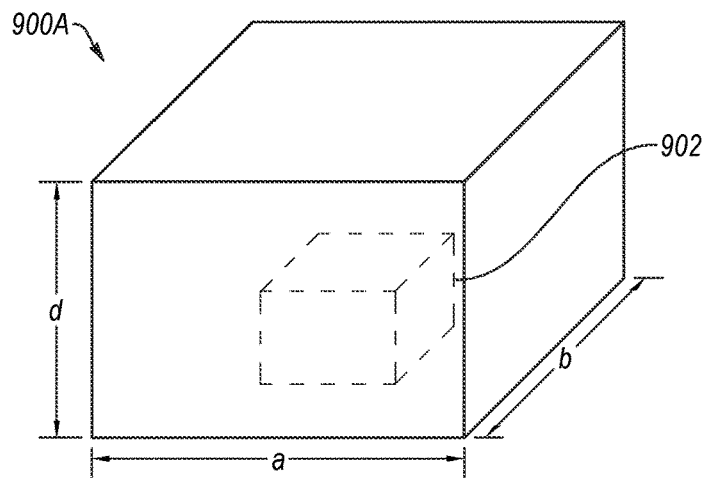
FIGS. 9A and 9B illustrate example resonant cavities that may be formed within hermetic enclosures.
Figure 9B:
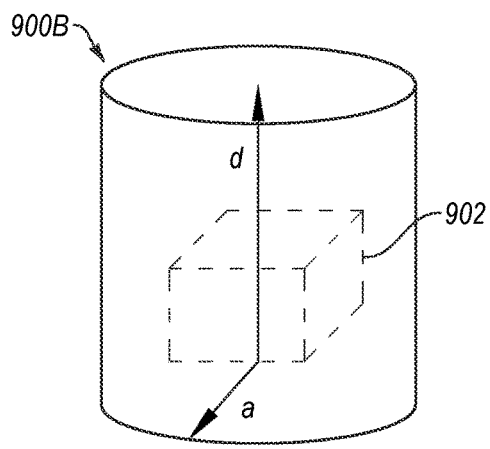

FIGS. 9A and 9B illustrate example resonant cavities 900A, 900B that may be formed within hermetic enclosures, arranged in accordance with at least one embodiment described herein. The resonant cavity 900A is an example of a 3D rectangular resonant cavity that may be formed within, e.g., the hermetic enclosure 702A of FIG. 7A. The resonant cavity 900B is an example of a cylindrical resonant cavity that may be formed within, e.g., the hermetic enclosure 702B of FIG. 7B. FIGS. 9A and 9B further depict in outline approximate placement of a corresponding bulk semiconductor crystal 902 within the resonant cavity 900A, 900B.

As illustrated in FIG. 9A, the resonant cavity 900A may have a width of a, a depth of b, and a height of d. As illustrated in FIG. 9B, the resonant cavity 900B may have a radius of a and a height of d. The resonant frequency $F_{max}$ for a resonant cavity may be determined according to Equation 3:

$$F_{max} = (c/2\sqrt{(E\mu)})\sqrt{((m/a)^{\wedge 2} + (n/d)^{\wedge 2} + (p/b)^{\wedge 2})} \quad \text{Equation 3.}$$

In Equation 3, c is speed of light, Eμ is permittivity, permeability constants, m, n, and p are number of half wave variations in resonant cavity in respective directions three axes of the box (a, b, d). Resonance condition exists for different modes of resonant cavity. The metallized coating may include a silver thin film, e.g., in the micrometer range, gold flash (e.g., 0.1 micrometers thick), and/or other metals, materials, or the like. Alternatively, or additionally, the metallized coating may be grounded. Forming the resonant cavity within the hermetic enclosure may enhance radiation amplitude and Q of the cavity enclosed by the hermetic enclosure compared to the hermetic enclosure without the resonant cavity. The Q of cylindrical resonant cavities, such as the resonant cavity 900B, may be superior to that of 3D rectangular resonant cavities, such as the resonant cavity 900A.

FIGS. 10A-10D illustrate example top covers 1000A-1000D (hereinafter collectively "top covers 1000" or generically "top cover 1000") that may be implemented in or as part of an hermetic enclosure of a wireless gamma and/or hard X-ray radiation detector, arranged in accordance with at least one embodiment described herein. The top cover 1000 may include, be included in, or correspond to other top covers described herein, such as the top cover 720 of FIGS. 7A and 7B.

To form a resonant cavity and/or to partially or completely shield infrared, radio wave, cosmic, and/or other unwanted radiation from reaching a corresponding bulk semiconductor crystal of the wireless gamma and/or hard X-ray radiation detector of which the top cover 1000 may be a part, the top cover 1000 may have one or more metallized coatings formed on one or more surfaces, or on at least a portion of each of one or more surfaces, of the top cover 1000. Although not illustrated in FIGS. 10A-10D, the top cover 1000 may be hermetically sealed to a corresponding base to form a resulting hermetic enclosure. In some embodiments, the metallized coating may cover virtually all of the top cover 1000 (and a corresponding base) except where one or more non-metallized apertures 1002A, 1002B, 1002C, 1002D (hereinafter generically "top aperture 1002"), 1004

(FIG. 10C, hereinafter "front aperture 1004"), and/or 1006 (hereinafter "front aperture 1006") are formed in the metallized coating.

The metallized coating may be transparent or substantially transparent to gamma and/or hard X-ray radiation and opaque or substantially opaque to THz radiation emitted by the bulk semiconductor crystal responsive to absorption of gamma and/or hard X-ray radiation. Accordingly, the top aperture 1002 may be formed in the metallized coating as a window for a corresponding THz EM wave receiver to detect the THz radiation, the THz EM wave receiver being aligned to the top aperture 1002. For example, FIGS. 10A-10D depict a THz EM wave receiver 1008A, 1008B, 1008C, 1008D aligned to the top aperture 1002. When assembled in the wireless gamma and/or hard X-ray radiation detector, the top cover 1000 may be aligned relative to the bulk semiconductor crystal such that emitted THz radiation, which is emitted in directions perpendicular to the direction of the electric field applied to the bulk semiconductor crystal, is directed through the top aperture 1002.

Figure 10A:
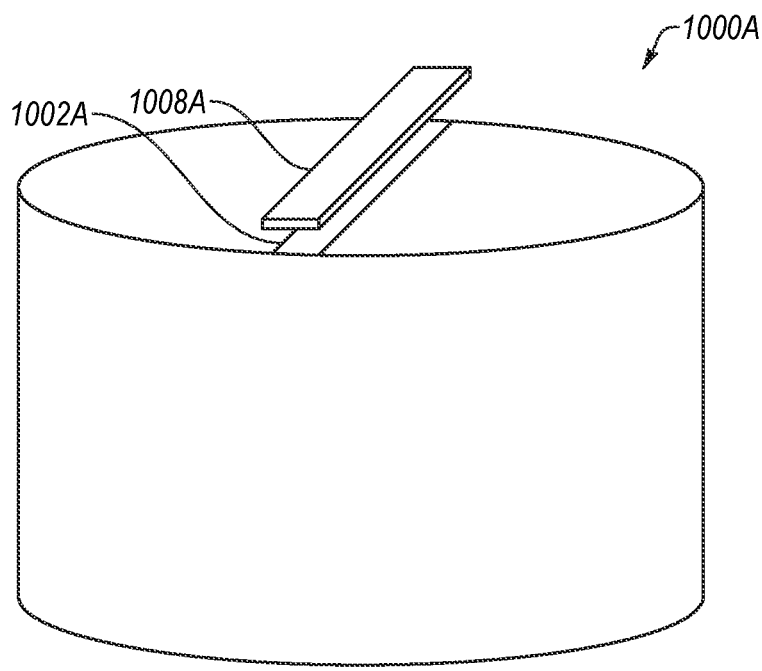
FIGS. 10A-10D illustrate example top covers that may be implemented in or as part of an hermetic enclosure of a wireless gamma and/or hard X-ray radiation detector.
Figure 10B:
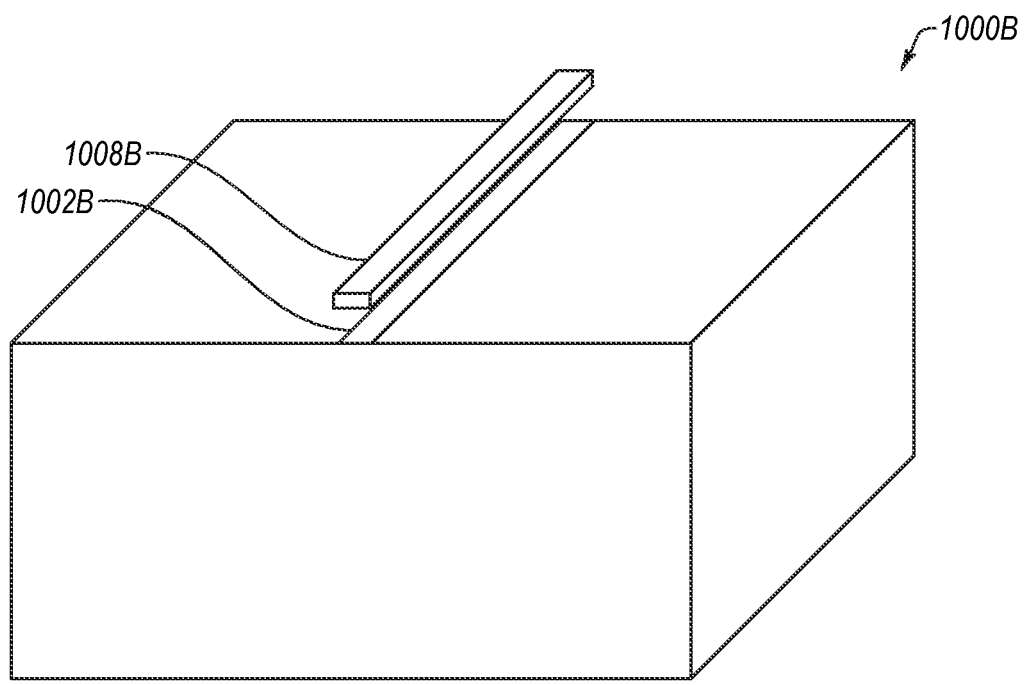
Figure 10C:
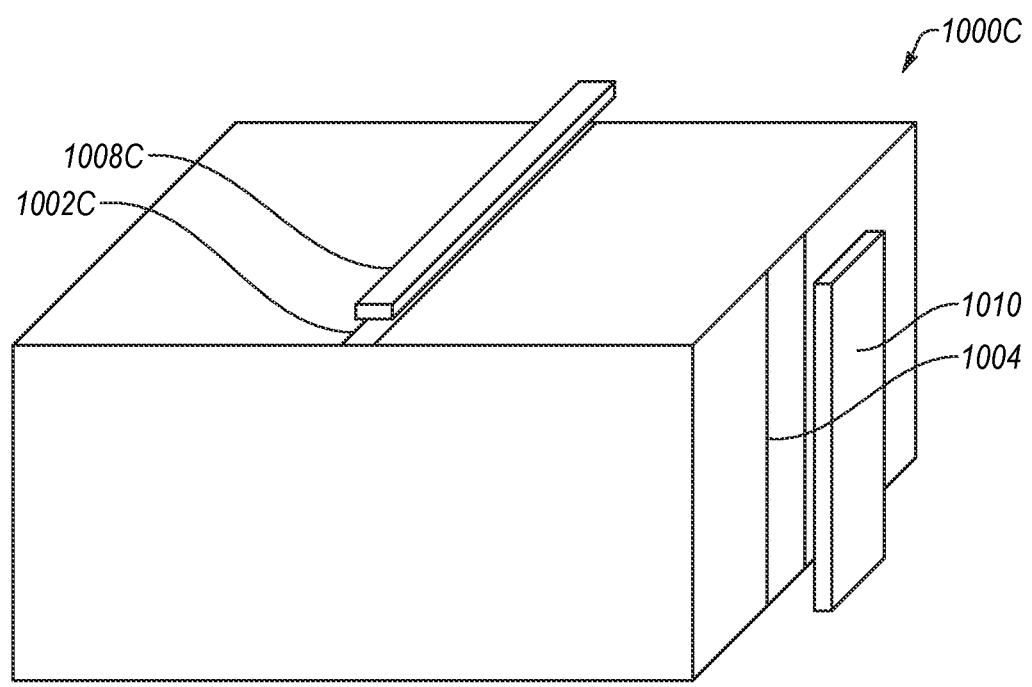

FIG. 10C illustrates an embodiment in which the wireless gamma and/or hard X-ray radiation detector further includes a magnet 1010. The magnet 1010 may include multilayer ceramic with a ferrite core and a multilayer coil, or other suitable magnet. Alternatively, or additionally, the magnet 1010 may be aligned to the front aperture 1004 to generate a magnetic field within the bulk semiconductor crystal of the wireless gamma and/or hard X-ray radiation detector. The relative alignment between the magnet 1010 and the bulk semiconductor crystal may be configured to generate the magnetic field perpendicular to the direction of the applied electric field. As such, the magnetic field may help deflect (e.g., accelerate) carriers from their trajectory as they are swept in the direction of the applied electric field, which may enhance (e.g., amplify) emission of THz radiation. In some embodiments, the magnetic field is a DC magnetic field. Although a single magnet 1010 is illustrated in FIG. 10C, embodiments herein may more generally include one or more magnets 1010 aligned to one or more corresponding non-metallized apertures.

Figure 10D:
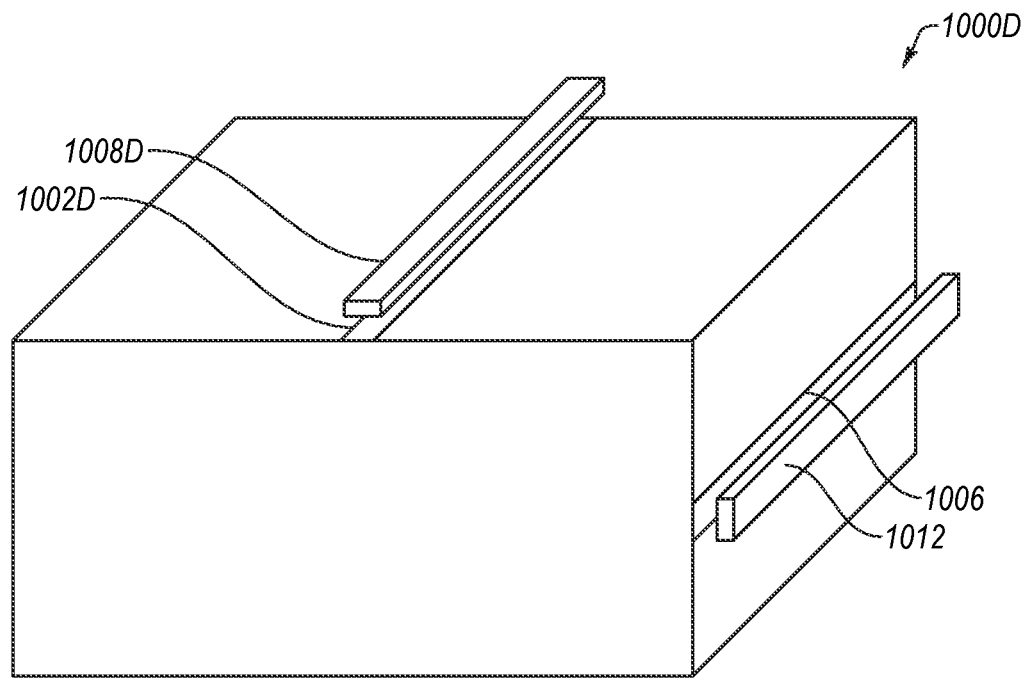

FIG. 10D illustrates an embodiment in which the wireless gamma and/or hard X-ray radiation detector further includes a second THz EM wave receiver 1012 aligned to the front aperture 1006. Inclusion of the second THz EM wave receiver 1012 may enhance detection of the THz radiation compared to embodiments that include only a single THz EM wave receiver, such as the embodiments of FIGS. 10A and 10B. FIGS. 10A-10C illustrate embodiments in which the wireless gamma and/or hard X-ray radiation detector includes a single THz EM wave receiver 1008 and FIG. 10D illustrates an embodiment in which the wireless gamma and/or hard X-ray radiation detector includes two THz EM wave receivers 1008D, 1012. More generally, embodiments of wireless gamma and/or hard X-ray radiation detectors herein may include one or more (e.g., two, three, four) THz EM wave receivers.

Figure 11:
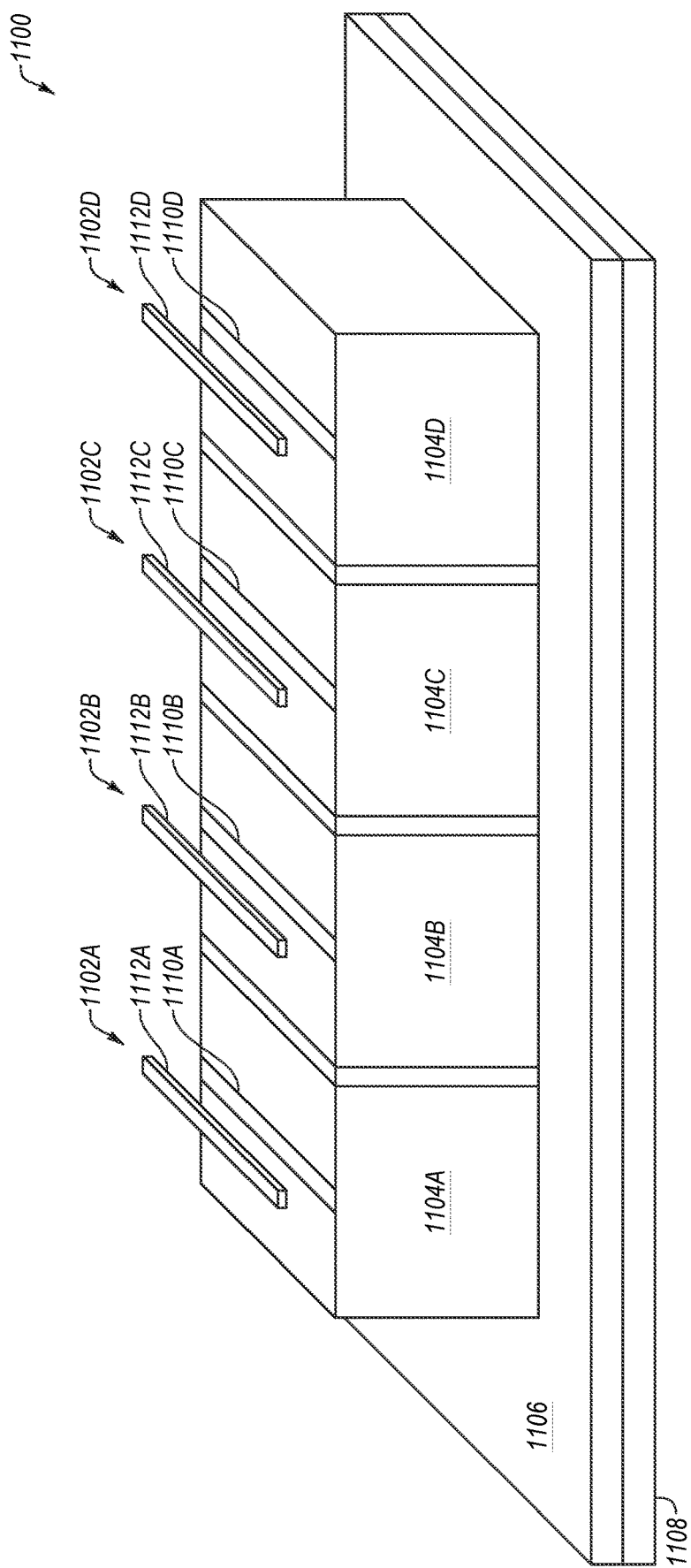
FIG. 11 illustrates an example array of wireless gamma and/or hard X-ray radiation detectors.

FIG. 11 illustrates an example array 1100 of wireless gamma and/or hard X-ray radiation detectors 1102A-1102D (hereinafter collectively "detectors 1102"), arranged in accordance with at least one embodiment described herein. As illustrated, each of the detectors 1102 includes a hermetic enclosure having a top cover 1104A-1104D hermetically sealed to a base 1106. The base 1106 may be shared between all the detectors 1102. The array 1100 may additionally include an external heat sink 1108 that may be shared between the detectors 1102. The external heat sink 1108 may be thermally coupled through each of the hermetic enclosures to a corresponding TEC and bulk semiconductor crystal. Each hermetic enclosure may include a metallized coating and a non-metallized aperture 1110A-1110D formed in the metallized coating. Each detector 1102 further includes a THz EM wave receiver 1112A-1112D aligned to the non-metallized aperture 1110A-1110D. The detectors 1102 may further include one or more of the other components of other wireless gamma and/or hard X-ray radiation detectors described herein, such as a bias circuit, switch, event detector circuit, electrical contacts, etc. and/or additional components. Each of the detectors 1102, hermetic enclosures, top covers 1104A-1104D, base 1106, external heat sink 1108, TECs, bulk semiconductor crystals, metallized coating, non-metallized aperture 1110A-1110D, THz EM wave receivers 1112A-1112D, bias circuit, switch, event detector circuit, and/or electrical contacts, may include, be included in, or correspond to other wireless gamma and/or hard X-ray radiation detectors, hermetic enclosures, top covers, bases, external heat sinks, TECs, bulk semiconductor crystals, metallized coatings, non-metallized apertures, THz EM wave receivers, bias circuit, switch, event detector circuit, and/or electrical contacts described herein.

In FIG. 11, the array 1100 of detectors 1102A-1102D is a linear or one-dimensional (1D) array of four detectors. Embodiments herein may alternatively or additionally include arrays with more or fewer detectors, two-dimensional (2D) arrays of detectors, or the like or any combination thereof.

Figure 12:
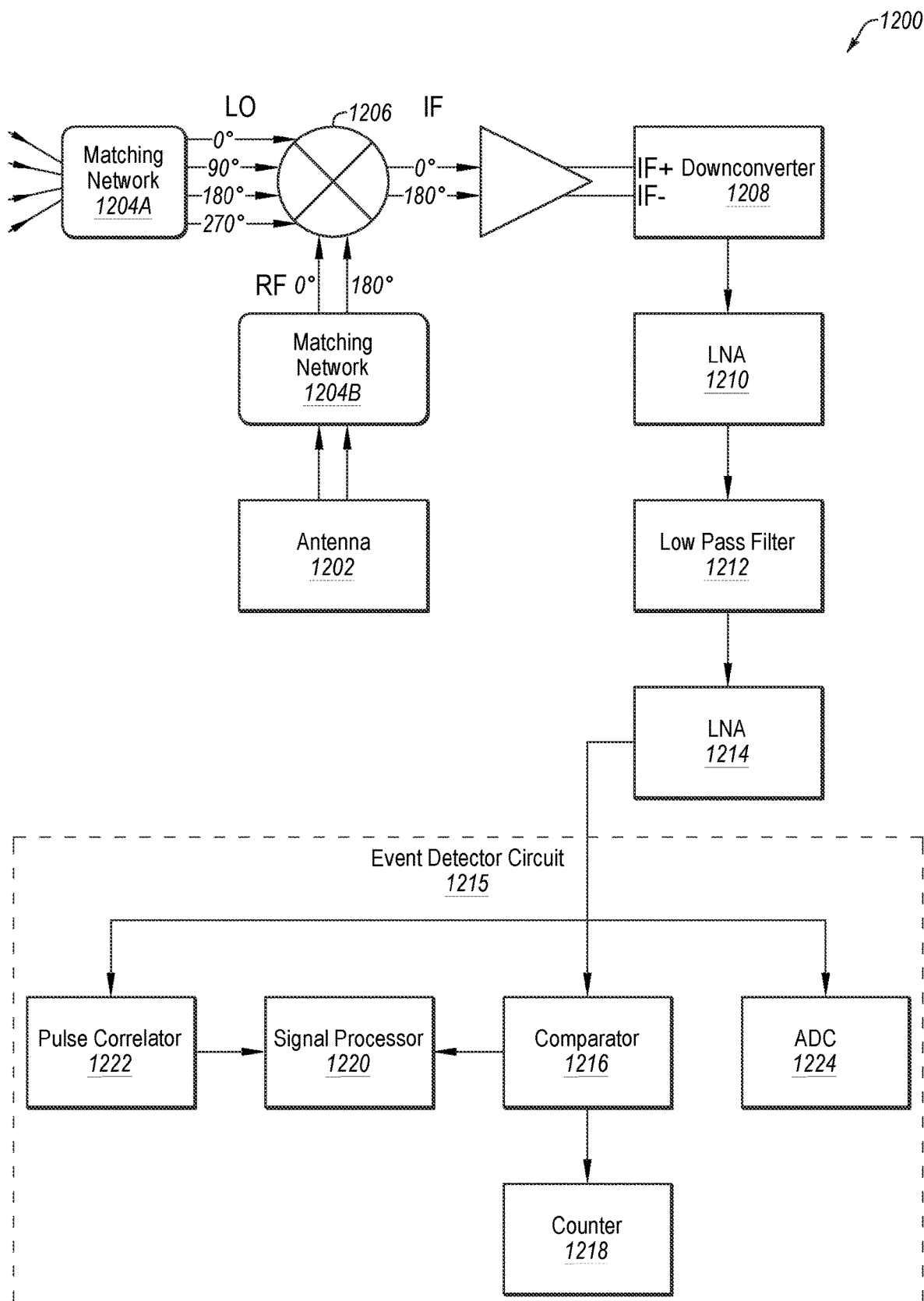
FIG. 12 illustrates an example THz EM wave receiver that may be implemented in a wireless gamma and/or hard X-ray radiation detector.

FIG. 12 illustrates an example THz EM wave receiver 1200 that may be implemented in a wireless gamma and/or hard X-ray radiation detector, arranged in accordance with at least one embodiment described herein. The THz EM wave receiver 1200 may include, be included in, or correspond to other THz EM wave receivers described herein, such as the THz EM wave receivers 114, 1008, 1112A-1112D of FIGS. 1, 10A-10D, and 11. In the illustrated embodiment, the THz EM wave receiver 1200 includes an antenna 1202, one or more matching networks 1204A, 1204B, a mixer 1206, a downconverter 1208, a first low noise amplifier (LNA) 1210, a low pass filter 1212, a second LNA 1214, and an event detector circuit 1215. The event detector circuit 1216 may include one or more of a comparator 1216, a counter 1218, a signal processor 1220, a pulse correlator 1222, and/or an analog-to-digital converter (ADC) 1224.

In operation, the antenna 1202 generates a signal responsive to reception of THz radiation. The mixer 1206 and downconverter 1208 reduce the frequency of the signal, followed by amplification by the first LNA 1210, filtering by the low pass filter 1212, and additional amplification by the second LNA 1214. The output of the second LNA 1214 may be passed on to the event detector circuit 1215, including to one or more of the comparator 1216, the pulse correlator 1222, and/or the ADC 1224. The comparator 1216 compares the signal to a reference signal such as a threshold. If the comparator 1216 determines that the signal exceeds the reference signal, the signal may be passed on to the signal processor 1220 and/or the counter 1218. The counter 1218 is incremented each time it receives a signal from the comparator 1216. The event detector circuit 1215 may include, be included in, or correspond to other event detector circuits described herein, such as the event detector circuit 116 of FIG. 1. The signal exceeding the reference signal and being counted by the counter 1218 may be referred to as a detection event. The signal processor 1220 may be implemented, e.g., with an array of THz EM wave receivers 1200, for imaging based on signals received from comparators of multiple THz EM wave receivers 1200 of the array. The signal processor 1220 may include a silicon-based very large scale integration (VLSI) integrated circuit (IC) or other suitable IC.

The antenna 1202 may include a patch antenna, a bowtie antenna, a slot-spiral antenna, an HEMT- or HBT-fed integrated monolithic antenna-amplifier structure, or another suitable antenna. In some embodiments the antenna 1202 is a broadband antenna and/or a tunable antenna. In embodiments that include an array of THz EM wave receivers 1200 as part of an array of wireless gamma and/or hard X-ray radiation detectors (such as the array 1100 of FIG. 11), at least some THz EM wave receivers 1200 in the array may have antennas 1202 optimized for different frequencies. In this and other embodiments, each of the antennas 1202 may be optimized for a different frequency than any other antenna 1202, or multiple subsets of antennas 1202 may be optimized for different frequencies where each antenna 1202 in a given set is optimized for the same frequency.

In some embodiments, the THz EM wave receiver 1200 may include GaAs-based HEMT and/or metal oxide semiconductor HEMT (MOSHEMT) structures or epitaxial base link SiGe HBT structures. Implementing the THz EM wave receiver 1200 as III-V HEMT-based structures may provide several advantages. For example, detection of greater than THz bandwidth may be plausible with HEMT technology. As another example, HEMT-based structures may be radiation-tolerant, which may be beneficial when working with high-power gamma and/or hard X-ray radiation. As another example, GaAs-based HEMT structures are the fastest room temperature transistor technology available. Implementing MOSHEMT in the THz EM wave receiver 1200 may further enhance the speed of response.

In some embodiments, the THz EM wave receiver 1200 and/or the signal processor 1220 may be monolithic based on epitaxial base link SiGe HBT and/or may include a monolithic or hybrid printed broadband antenna.

Embodiments of the THz EM wave receivers herein may be based on event detection. The onset of THz radiation (generated by the corresponding bulk semiconductor crystal in response to exposure to gamma and/or hard X-ray radiation) may trigger the counter 1218 to count events. In some embodiments, there is no linear measurement mechanism to measure the exact power of the THz radiation (and thus of the gamma and/or hard X-ray radiation). Some embodiments may perform peak detection and timing measurements.

Although not illustrated in FIG. 12, the THz EM wave receiver 1200 may further include or be coupled to a trigger or switch, such as the switch 118 of FIG. 1. The comparator 1216, the trigger or switch, and/or other components of the THz EM wave receiver 1200 may be monolithically integrated. The trigger or switch may shut off the detector bias (e.g., the bias of the bulk semiconductor crystal) and/or the magnet(s) (in embodiments that include one or more magnets) after each detection event to reduce the amount of THz radiation after each detection event which may shorten the detection fall time or tail. In particular, shutting off the detector bias and/or the magnets may reduce acceleration (e.g., change in velocity and/or direction) of carriers in a corresponding bulk semiconductor crystal which in turn may reduce THz radiation emitted by the bulk semiconductor crystal.

An example embodiment of a wireless gamma and/or hard X-ray radiation detector (hereinafter "detector") will now be described. The detector may include a bulk InSb semiconductor crystal with a volume less than 1 cm$^3$. The bulk InSb semiconductor crystal may be undoped or n-type lightly doped with chromium having a concentration less than 1×10'. Electrical contacts coupled to the bulk semiconductor crystal may include gold electrical contacts. The electrical contacts may be coupled to a bias circuit to apply an electric field across the bulk semiconductor crystal. The bulk semiconductor crystal may be enclosed within an hermetic enclosure filled with xenon gas for thermal isolation and may be operated at, e.g., −80° C., by a TEC included in the detector. The hermetic enclosure may have a metallized coating, such as an evaporated metal coating, on selected areas (see, e.g., FIGS. 10A-10D) to eliminate or reduce infrared radiation, radio wave radiation, and/or cosmic radiation that may otherwise disturb the bulk semiconductor crystal. The bulk InSb semiconductor crystal may have a thermal conductivity greater than 170 watts per meter-kelvin (W/m·K). Thermal load of the detector may be extremely low since the bulk semiconductor crystal is not operated in photoconductive mode and since the bulk semiconductor crystal is biased at an extremely low bias voltage, e.g., of 2 volts or less.

In this example, when the bulk semiconductor crystal is hit with high energy gamma and/or X-ray radiation having energy less than 0.7 MeV (MeV), carriers (e.g., electrons and holes) may be freed in the bulk semiconductor crystal due to the photoelectric effect and impact ionization. Electron hole pairs freed due to absorption of gamma and/or hard X-ray radiation with energies greater than 100 keV may be accelerated by the energy absorbed from the gamma and/or hard X-ray radiation and by the electric field applied across the bulk semiconductor crystal. The accelerating carriers create an avalanche of electrons and holes thru impact ionization. In addition, and due to accelerated electrons in InSb having high mobility, the large contrast between electron mobility and hole mobility in InSb (e.g., electron mobility of >1×10$^5$ cm$^2$/(V·s) at 200 K compared to hole mobility of 1.2×10$^3$ cm$^2$/(V·s) at 200 K), mean free path of about 1 micrometer, and the very low electron effective mass (e.g., 0.014 m$_e$/m$_0$) of InSb, electron acceleration will dominate and radiate electromagnetic radiation at frequencies in the THz range (referred to herein as "THz radiation"). Operation of the bulk semiconductor crystal at less than −60° C. may reduce or eliminate adverse thermal and electrical effects, such as low bulk resistance and breakdown which can lead to electrical shorts.

Optionally, the detector may further include a magnet positioned outside the hermetic enclosure, such as the magnet 1010 of FIG. 10C. The magnet may be positioned to provide a magnetic field that is perpendicular to the direction of the applied electric field. The magnetic field may deflect carriers from their trajectory as they are swept across the bulk semiconductor crystal by the electric field. The deflection by the magnetic field may enhance emission of THz radiation.

Some embodiments herein rely on emission of electromagnetic radiation from bulk semiconductor crystal when charges are accelerated. The frequency of the emitted electromagnetic radiation depends on the acceleration (e.g., positive change in velocity in a short period of time). The emitted electromagnetic radiation may be most powerful in a direction perpendicular to axis of motion of accelerated charge carriers. The derivation of the electric field and magnetic field (E/B) of an accelerated charge as considered and exploited according to embodiments herein will now be described.

Figure 13:
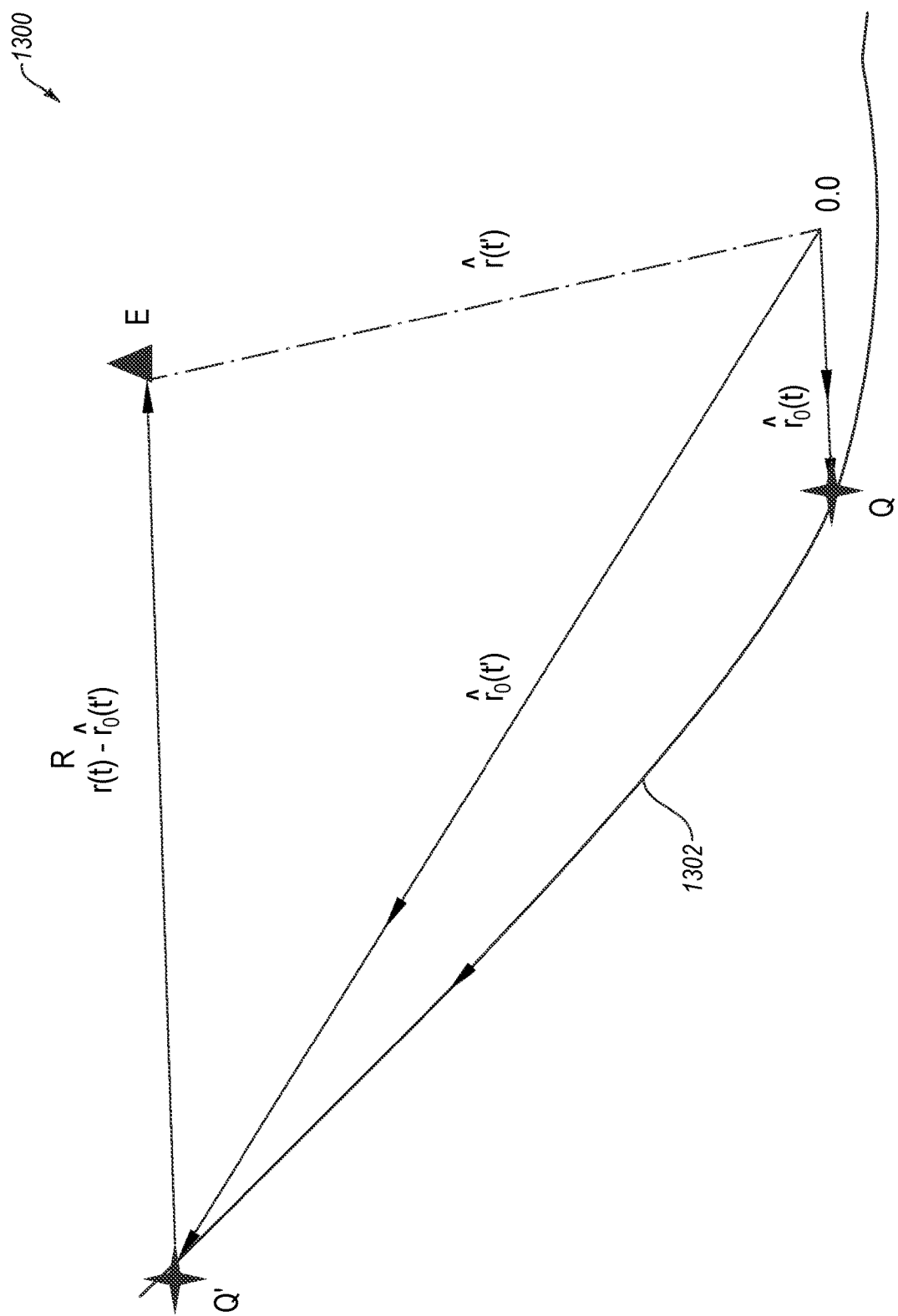
FIG. 13 illustrates a trajectory of a single charge accelerated due to impact ionization/charge multiplication FIG. 14 includes graphs illustrating simulated electric field pulse emission from impact ionization in a bulk InSb semiconductor crystal, all arranged in accordance with at least one embodiment described herein.

FIG. 13 illustrates a trajectory 1302 of a randomly moving charge Q (at a first point in its trajectory 1302), Q' (at a second point in its trajectory 1302). The retarded measured time t' of the randomly moving charge may be calculated according to Equation 4:

$$t' = \frac{[t - \hat{r}(t) - \vec{r_0}(t')]}{c}.$$

Equation 4

In Equation 4, t is time, r̂(t) is retarded radial distance vector, r̂₀ (e) is initial radial distance vector, and c is the speed of light. No need to explain Equations 5-7 _____:

$$R(t') = |\hat{r}(t) - \hat{r_0}(t')|$$ Equation 5.

$$R(t') = |\hat{r}(t) - \hat{r_0}(t')|$$ Equation 6.

$$\hat{R} = R(t')/|R(t')|$$ Equation 7.

The outputs of the foregoing may then be used to determine the electric field $E_{rad}$ of a radiating electron according to Equation 8:

$$E_{rad}(r, t) = \frac{q}{4\pi\epsilon_0}\left[\frac{\hat{R}}{R} \times \frac{1}{c^2}(\hat{R} \times \dot{v})\right].$$

Equation 8

In equation 8, q is electron charge, v̇ is charge acceleration (d(velocity)/dt, and the other variables and constants are as already described.

The Poynting Vector $S=E_{rad}\times B_{rad}$ describes the electromagnetic wave travel from a radiating electron. $E_{rad}$ (the electric field) and $B_{rad}$ (the magnetic field) are at perpendicular angles to the Poynting Vector S. An angle θ is the angle between the E field (e.g., external voltage bias field) (voltage bias/distance is the electric field applied) and the axis electron acceleration. $E_{rad}$ and the magnetic field $B_{rad}$ of the radiating electron are related according to Equation 9:

$$|E_{rad}| = c|B_{rad}| = \frac{q}{4\pi\epsilon_0}\frac{\dot{v}}{Rc^2}\sin\theta.$$

Equation 9

The Poynting Vector S is in the direction of R̂ with a magnitude that may be calculated according to Equation 10:

$$S = \frac{1}{\mu_0 c}E_{rad}^2 = \frac{\mu_0}{16\pi^2 c}\frac{q^2\dot{v}^2}{R^2}\sin^2\theta.$$

Equation 10

S is the EM energy dW emitted per unit time dt per unit area dA, or S=dW/dtdA. In turn, dA may be calculated as $R^2$ dΩ, where dΩ is the solid angle about the direction R̂ of S. As such, the power emitted per solid angle may be calculated according to Equation 11:

$$\frac{dW}{dtd\Omega} = S\ R^2 = \frac{\mu_0}{16\pi^2 c}q^2\dot{v}^2\sin^2\theta.$$

Equation 11

The characteristic dipole pattern is proportional to $\sin^2\theta$: there is no emission in the direction of acceleration and the maximum radiation is emitted perpendicular to the acceleration. The total EM power emitted into all angles is obtained by integrating Equation 12:

$$P = \frac{dW}{dt} =$$

Equation 12

$$\frac{\mu_0}{16\pi^2 c}q^2\dot{v}^2\int_0^{2\pi}\int_0^{\pi}\sin^2\theta\sin\theta\,d\theta\,d\phi = \frac{\mu_0}{8\pi c}q^2\dot{r}_0^2\int_{-1}^{+1}(1-\mu^2)d\mu,$$

As evident from Equation 12, the power of an EM wave is strongly dependent on acceleration of a charged carrier. High mobility and low effective mass my increase the power of the EM wave.

Integration of Equation 12 leads to Equation 13, also known as the Larmor formula:

$$P = \frac{\mu_0 q^2 \dot{r}_0^2}{6\pi c}.$$

Equation 13

The electric field $E_{rad}$ of an ensemble of radiating electrons may be determined according to Equation 14 (in contrast to Equation 8 which is applicable to a single radiating electron):

$$E_{rad} = \sum_i \frac{q_i}{4\pi\epsilon_0}\left[\frac{\hat{R}_i}{R_i} \times \frac{1}{c^2}(\hat{R}_i \times \ddot{r}_i)\right].$$

Equation 14

In equation 14, $R_i$ is the distance between each source point $r_i$ and the field point r. But the differences between the $R_i$ may be negligible, particularly as r→∞. As such, $R=|r-r_0(t')|$ may be used as the characteristic distance together with the definition for the dipole moment, $d=\Sigma_i q_i r_i$, to determine the electric field for an ensemble of radiating electrons according to Equation $$E_{rad} = \frac{1}{4\pi\epsilon_0}\left[\frac{\hat{R}}{R} \times \frac{1}{c^2}(\hat{R} \times \ddot{d})\right].$$

Equation 15

The power emitted per solid angle may then be calculated according to Equation 16:

$$\frac{dW}{dtd\Omega} = \frac{\mu_0}{16\pi^2 c}\ddot{d}^2\sin^2\theta.$$

Equation 16

As evident from Equation 16, the radiation depends strongly on acceleration of carriers.

The Fourier transform of the acceleration of a particle may be determined according to the Fourier transform pair of Equations 17:

$$\dot{v}(t) = \frac{1}{(2\pi)^{1/2}}\int_{-\infty}^{+\infty}\dot{v}(\omega)\exp(-i\omega t)d\omega$$

Equation 17

$$\dot{v}(\omega) = \frac{1}{(2\pi)^{1/2}}\int_{-\infty}^{+\infty}\dot{v}(t)\exp(i\omega t)dt.$$

Parseval's theorem relates Equations 17 according to Equation 18:

$$\int_{-\infty}^{+\infty}|\dot{v}(\omega)|^2 d\omega = \int_{-\infty}^{+\infty}|\dot{v}(t)|^2 dt$$

Equation 18.

The relation according to Equation 19 is also valid provided $\dot{v}(t)$ is real:

$$\int_0^\infty |\dot{v}(\omega)|^2 d\omega = \int_{-\infty}^0 |\dot{v}(\omega)|^2 d\omega \qquad \text{Equation 19.}$$

The total energy radiated by a single charged particle with an acceleration history $\dot{v}(t)$ may then be determined by applying the foregoing relations to the Larmor formula (Equation 13) according to Equation 20:

$$\int_{-\infty}^{+\infty} P\, dt = \int_{-\infty}^{+\infty} \frac{\mu_0 q^2}{6\pi c} |\dot{v}(t)|^2 dt = \frac{\mu_0 q^2}{3\pi c} \int_0^\infty |\dot{v}(\omega)|^2 d\omega. \qquad \text{Equation 20}$$

Since the total emitted energy must also equal $$\int_0^\infty \left(\frac{dW}{dw}\right) dw,$$

then the energy unit bandwidth may be determined according to Equation 21:

$$\frac{dW}{d\omega} = \frac{\mu_0 q^2}{3\pi c} |\dot{v}(\omega)|^2. \qquad \text{Equation 21}$$

The energy per unit bandwidth is emitted only during the period that the particle is experiencing acceleration. In the dipole approximation for multiple particles, Equation 21 becomes Equation 22:

$$\frac{dW}{d\omega} = \frac{\mu_0}{3\pi c} \omega^4 |d(\omega)|^2. \qquad \text{Equation 22}$$

FIG. 14 includes graphs 1400A, 1400B illustrating simulated electric field pulse emission from impact ionization in a bulk InSb semiconductor crystal excited by 511 keV photon absorption at 77 K, biased at 100 mV DC bias. The InSb semiconductor is chromium doped, $N=1\times10^{14}$. The graph 1400A shows EM field of the simulated electric field as a function of time and the graph 1400B shows field amplitude of the simulated electric field as a function of frequency.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A wireless gamma and/or hard X-ray radiation detector, comprising:
   a bulk semiconductor crystal comprising indium antimonide (InSb);
   electrical contacts coupled to two facets of the bulk semiconductor crystal;
   a bias circuit electrically coupled to the bulk semiconductor crystal through the electrical contacts;
   a terahertz (THz) electromagnetic (EM) wave receiver positioned to detect THz radiation emitted by the bulk semiconductor crystal;
   a hermetic enclosure within which the bulk semiconductor crystal is positioned; and
   xenon gas within the hermetic enclosure.

2. The wireless gamma and/or hard X-ray radiation detector of claim 1, further comprising:
   a thermoelectric cooler (TEC) positioned within the hermetic enclosure and thermally coupled to the bulk semiconductor crystal, the TEC capable of −80° C. delta temperature gradient;
   a temperature sensor positioned within the hermetic enclosure and thermally coupled to the bulk semiconductor crystal; and
   a TEC controller communicatively coupled to the TEC and the temperature sensor and configured to control a temperature of the TEC and the bulk semiconductor crystal based on a temperature signal from the temperature sensor.

3. The wireless gamma and/or hard X-ray radiation detector of claim 2, further comprising a heat sink positioned outside the hermetic enclosure and thermally coupled to the TEC through the hermetic enclosure.

4. The wireless gamma and/or hard X-ray radiation detector of claim 1, wherein at least one of:
   each of the electrical contacts comprises at least one of gold, graphene, InSb graphene, copper, nickel, or indium aluminum antimonide (InAlSb);
   the bias circuit is coupled to a voltage supply and comprises a current limiting resistor coupled in series between the voltage supply and one of the electrical contacts, the current limiting resistor configured to control breakdown voltage;
the electrical contacts comprise three or more electrical contacts; or
the bias circuit is configured to supply a DC bias to the bulk semiconductor crystal of less than 2 volts.

5. The wireless gamma and/or hard X-ray radiation detector of claim 1, wherein the wireless gamma and/or hard X-ray radiation detector is configured to bypass photocurrent/carrier transport as a detection mechanism and take advantage of low power consumption and EM radiation due to acceleration of charges from impact ionization and phenomenon carrier dynamics.

6. The wireless gamma and/or hard X-ray radiation detector of claim 1, wherein the wireless gamma and/or hard X-ray radiation detector is configured to detect gamma and/or hard X-ray radiation without photocurrent or carrier transport detection mechanism in the bulk semiconductor crystal.

7. The wireless gamma and/or hard X-ray radiation detector of claim 1, wherein the wireless gamma and/or hard X-ray radiation detector is configured to detect gamma and/or hard X-ray radiation by detection at the THz EM wave receiver of THz radiation emitted by the bulk semiconductor crystal responsive to absorption by the bulk semiconductor crystal of gamma and/or hard X-ray radiation.

8. The wireless gamma and or hard X-ray radiation detector of claim 1, wherein the hermetic enclosure comprises a metallized coating and a non-metallized aperture formed in the metallized coating, the THz EM wave receiver aligned to the non-metallized aperture.

9. The wireless gamma and/or hard X-ray radiation detector of claim 8, wherein the hermetic enclosure forms a resonant cavity to enhance amplitude of the THz radiation.

10. The wireless gamma and/or hard X-ray radiation detector of claim 9, wherein the hermetic enclosure is cylindrical.

11. The wireless gamma and/or hard X-ray radiation detector of claim 1, wherein the electrical contacts comprise three or more electrical contacts.

12. The wireless gamma and/or hard X-ray radiation detector of claim 1, further comprising a metal coating formed on multiple sides of the bulk semiconductor crystal.

13. The wireless gamma and/or hard X-ray radiation detector of claim 1, wherein the THz EM wave receiver is positioned on a first surface of the hermetic enclosure, the wireless gamma and/or hard X-ray radiation detector further comprising a second THz EM wave receiver positioned on a second surface of the hermetic enclosure orthogonal to the first surface.

14. The wireless gamma and/or hard X-ray radiation detector of claim 1, further comprising an event detection circuit coupled to the THz EM wave receiver, the event detector circuit configured to sense detection events based on a THz radiation detection signal output by the THz EM wave receiver to the event detection circuit.

15. The wireless gamma and/or hard X-ray radiation detector of claim 14, further comprising an ultra high-speed switch coupled to the bias circuit and the event detector circuit and configured to switch off the bias circuit for at least a predetermined time interval after each detection event.

16. The wireless gamma and/or hard X-ray radiation detector of claim 1, wherein the bulk semiconductor crystal is configured to absorb gamma and/or hard X-ray radiation via at least one of photoelectric effect, Compton scattering, or pair production.

17. A wireless gamma and/or hard X-ray radiation detector, comprising:
a bulk semiconductor crystal comprising indium antimonide (InSb), cadmium telluride (CdTe), or cadmium zinc telluride (CdZnTe);
electrical contacts coupled to two facets of the bulk semiconductor crystal;
a bias circuit electrically coupled to the bulk semiconductor crystal through the electrical contacts; and
a terahertz (THz) electromagnetic (EM) wave receiver positioned to detect THz radiation emitted by the bulk semiconductor crystal;
wherein application of a bias voltage by the bias circuit to the bulk semiconductor crystal through the electrical contacts generates an electric field within the bulk semiconductor crystal, the wireless gamma and/or hard X-ray radiation detector further comprising a magnet positioned to impart a magnetic field within the bulk semiconductor crystal that is perpendicular to the electric field.

18. A gamma and/or hard X-ray detector system comprising an array of wireless gamma and/or hard X-ray radiation detectors, each of the wireless gamma and/or hard X-ray radiation detectors in the array comprising:
a bulk semiconductor crystal comprising indium antimonide (InSb);
electrical contacts coupled to two facets of the bulk semiconductor crystal;
a bias circuit electrically coupled to the bulk semiconductor crystal through the electrical contacts;
a terahertz (THz) electromagnetic (EM) wave receiver positioned to detect THz radiation emitted by the bulk semiconductor crystal;
a hermetic enclosure within which the bulk semiconductor crystal is positioned; and
xenon gas within the hermetic enclosure.

19. A wireless gamma and/or hard X-ray radiation detector, comprising:
a bulk indium antimonide (InSb) semiconductor crystal configured to emit terahertz (THz) radiation in response to absorption of gamma and/or hard X-ray radiation;
a metal coating formed on multiple sides of the bulk InSb semiconductor crystal;
a hermetic enclosure surrounding the bulk InSb semiconductor crystal
xenon gas disposed within the hermetic enclosure, the hermetic enclosure and the xenon gas configured to thermally isolate the bulk InSb semiconductor crystal from an external environment;
a thermoelectric cooler (TEC) positioned within the hermetic enclosure and thermally coupled to the bulk InSb semiconductor crystal;
a temperature sensor positioned within the hermetic enclosure and thermally coupled to the bulk InSb semiconductor crystal;
a TEC controller communicatively coupled to the TEC and the temperature sensor and configured to control a temperature of the TEC and the bulk InSb semiconductor crystal based on a temperature signal from the temperature sensor;
an external heat sink positioned outside the hermetic enclosure and thermally coupled to the TEC through the hermetic enclosure;

low thermal conductivity electrical contacts coupled to two facets of the bulk InSb semi conductor crystal;
a bias circuit electrically coupled to the bulk InSb semiconductor crystal through the low thermal conductivity electrical contacts and configured to apply a bias voltage to the bulk InSb semiconductor crystal through the low thermal conductivity electrical contacts to generate an electric field within the bulk InSb semiconductor crystal;
a THz electromagnetic (EM) wave receiver positioned outside the hermetic enclosure to detect THz radiation emitted by the bulk InSb semiconductor crystal; and
an event detection circuit coupled to the THz EM wave receiver, the event detector circuit configured to detect gamma and/or hard X-ray radiation absorption events based on a THz radiation detection signal output by the THz EM wave receiver to the event detector circuit;
wherein:
the bias circuit is coupled to a voltage supply and comprises a current limiting resistor coupled in series between the voltage supply and one of the low thermal conductivity electrical contacts;
the bias circuit is configured to supply a DC bias to the bulk InSb semiconductor crystal of less than 2 volts;
the hermetic enclosure comprises a metallized coating and a non-metallized aperture formed in the metallized coating, the THz EM wave receiver aligned to the non-metallized aperture; and
the hermetic enclosure forms a resonant cavity to enhance amplitude of the THz radiation.

20. The wireless gamma and/or hard X-ray radiation detector of claim 19, further comprising at least one of:
an ultra high-speed switch coupled to the bias circuit and the event detector circuit and configured to switch off the bias circuit for at least a predetermined time interval after each detected gamma and/or hard X-ray radiation absorption event;
a magnet positioned to impart a magnetic field within the bulk InSb semiconductor crystal that is perpendicular to the electric field; or
a second THz EM wave receiver positioned on a first surface of the hermetic enclosure that is orthogonal to a second surface of the hermetic enclosure on which the THz EM wave receiver is positioned.

21. The wireless gamma and/or hard X-ray radiation detector of claim 19, wherein the THz EM wave receiver includes at least one of an autocorrelator, a comparator, a low noise amplifier (LNA), a mixer, or an integrated antenna/first stage amplifier in gallium arsenide (GaAs) metal oxide semiconductor high-electron-mobility transistor (MOSHEMT) and epitaxial base link silicon germanium (SiGe) heterojunction bipolar transistor (HBT) for room temperature THz range circuit operation.

* * * * *